(12) United States Patent
Mays et al.

(10) Patent No.: US 11,978,657 B2
(45) Date of Patent: May 7, 2024

(54) FILLING OPENINGS BY COMBINING NON-FLOWABLE AND FLOWABLE PROCESSES

(71) Applicant: Intel Corporation, Santa Clara, CA (US)

(72) Inventors: Ebony L. Mays, Hillsboro, OR (US); Bruce J. Tufts, Banks, OR (US)

(73) Assignee: Intel Corporation, Santa Clara, CA (US)

( * ) Notice: Subject to any disclaimer, the term of this patent is extended or adjusted under 35 U.S.C. 154(b) by 16 days.

(21) Appl. No.: 16/642,132

(22) PCT Filed: Sep. 28, 2017

(86) PCT No.: PCT/US2017/053853
§ 371 (c)(1),
(2) Date: Feb. 26, 2020

(87) PCT Pub. No.: WO2019/066830
PCT Pub. Date: Apr. 4, 2019

(65) Prior Publication Data
US 2020/0365447 A1    Nov. 19, 2020

(51) Int. Cl.
*H01L 21/76*    (2006.01)
*H01L 21/02*    (2006.01)
(Continued)

(52) U.S. Cl.
CPC .. *H01L 21/76224* (2013.01); *H01L 21/02271* (2013.01); *H01L 21/0228* (2013.01); *H01L 21/02282* (2013.01); *H01L 29/0649* (2013.01)

(58) Field of Classification Search
CPC ......... H01L 21/76224; H01L 21/02271; H01L 21/0228; H01L 21/02282; H01L 29/0649;
(Continued)

(56) References Cited

U.S. PATENT DOCUMENTS

| 4,855,804 A | * | 8/1989 | Bergami | ........... H01L 21/02164 |
| | | | | 257/513 |
| 6,242,317 B1 | * | 6/2001 | Gardner | ............ H01L 21/76224 |
| | | | | 257/E21.546 |

(Continued)

FOREIGN PATENT DOCUMENTS

| KR | 101035612 B1 | 5/2011 |
| WO | 2019066830 A1 | 4/2019 |

OTHER PUBLICATIONS

PCT International Search Report and Written Opinion dated Jun. 28, 2018 in PCT Application No. PCT/US2017/053853; 11 pages.
(Continued)

*Primary Examiner* — Mohammad M Hoque
(74) *Attorney, Agent, or Firm* — Schwabe, Williamson & Wyatt, P.C.

(57) ABSTRACT

Disclosed herein are methods for manufacturing IC components using bottom-up fill of openings with a dielectric material. In one aspect, an exemplary method includes, first, depositing a solid dielectric liner on the inner surfaces of the openings using a non-flowable process, and subsequently filling the remaining empty volume of the openings with a fill dielectric using a flowable process. Such a combination method may maximize the individual strengths of the non-flowable and flowable processes due to the synergetic effect achieved by their combined use, while reducing their respective drawbacks. Assemblies and devices manufactured using such methods are disclosed as well.

19 Claims, 19 Drawing Sheets

(51) Int. Cl.
*H01L 21/762* (2006.01)
*H01L 29/06* (2006.01)

(58) Field of Classification Search
CPC ......... H01L 21/76897; H01L 21/76801; H01L 21/76837; H01L 21/76834; H01L 21/02219; H01L 21/02126; H01L 21/02167; H01L 21/02263; H01L 21/02274; C23C 16/52; C23C 16/56; C23C 16/045
USPC ........................................................ 257/506
See application file for complete search history.

(56) References Cited

U.S. PATENT DOCUMENTS

| | | |
|---|---|---|
| 2005/0202584 A1 | 9/2005 | Mouli |
| 2007/0087565 A1* | 4/2007 | Culmsee ............. H01L 21/3081 257/E21.232 |
| 2007/0205489 A1* | 9/2007 | Tilke ................. H01L 21/76229 257/E21.549 |
| 2010/0123211 A1* | 5/2010 | Kim .................. H01L 29/66621 257/E29.007 |
| 2010/0230757 A1 | 9/2010 | Chen et al. |
| 2011/0151676 A1 | 6/2011 | Ingle et al. |
| 2011/0165757 A1* | 7/2011 | Kim .................. H01L 21/76229 257/E21.546 |
| 2012/0153492 A1* | 6/2012 | Bachman ............ H01L 25/0657 257/774 |
| 2012/0235273 A1 | 9/2012 | Chen et al. |
| 2013/0049219 A1 | 2/2013 | Tsai |
| 2015/0303250 A1 | 10/2015 | Ishikawa |
| 2017/0062496 A1* | 3/2017 | Lai .................... H01L 27/14645 |

OTHER PUBLICATIONS

Office Action from U.S. Appl. No. 18/088,467, dated Jul. 6, 2023, 16 pgs.

* cited by examiner

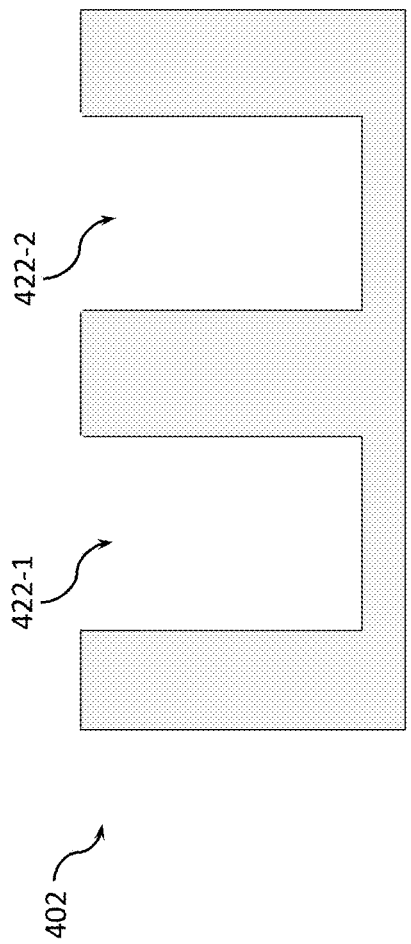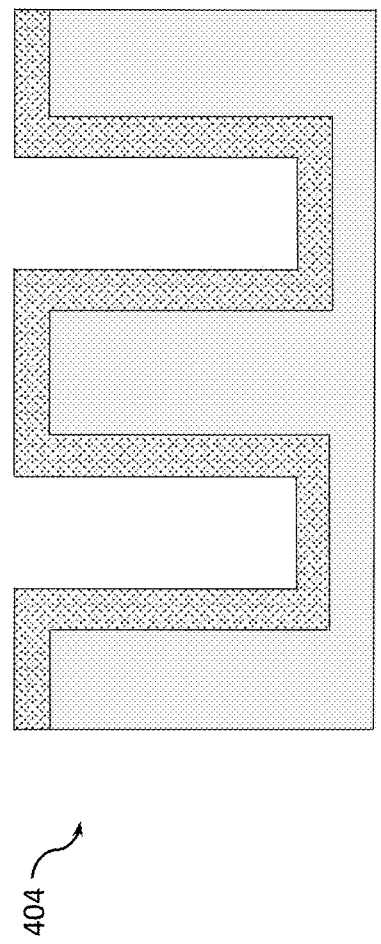
FIG. 4A
FIG. 4B

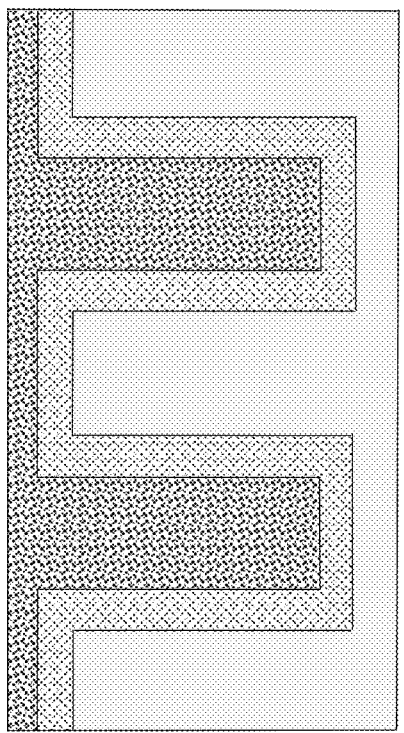
FIG. 4C
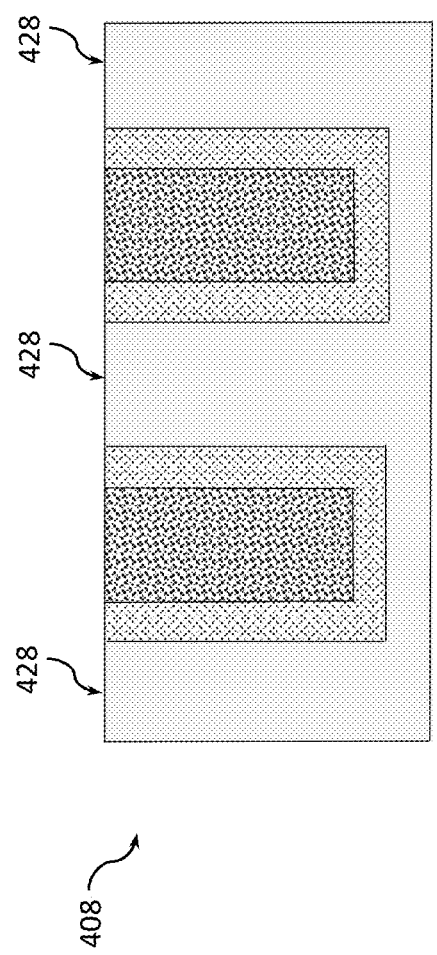
FIG. 4D
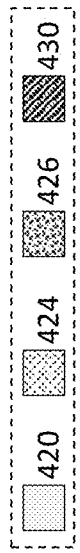

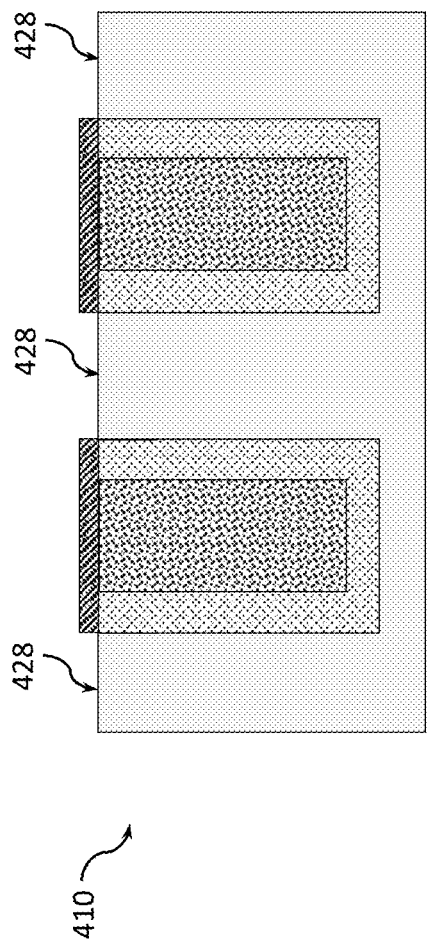
FIG. 4E
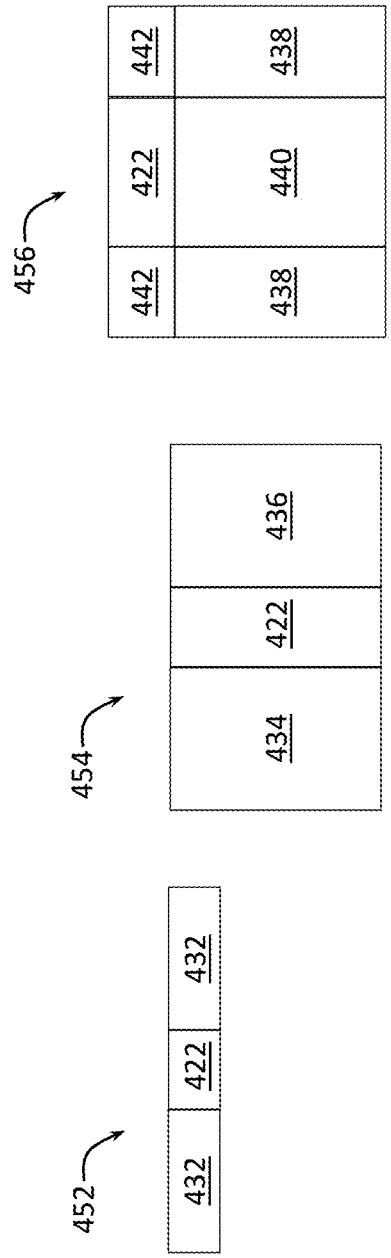
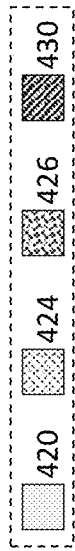
FIG. 4F

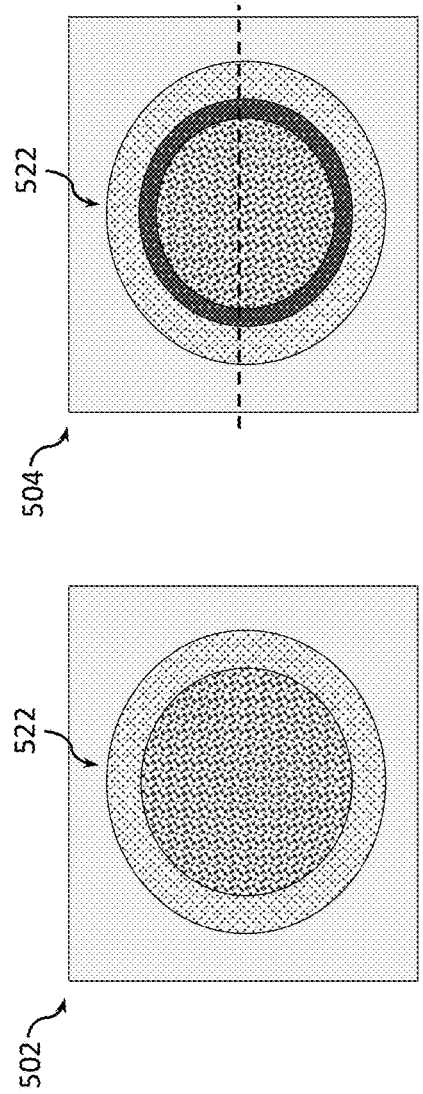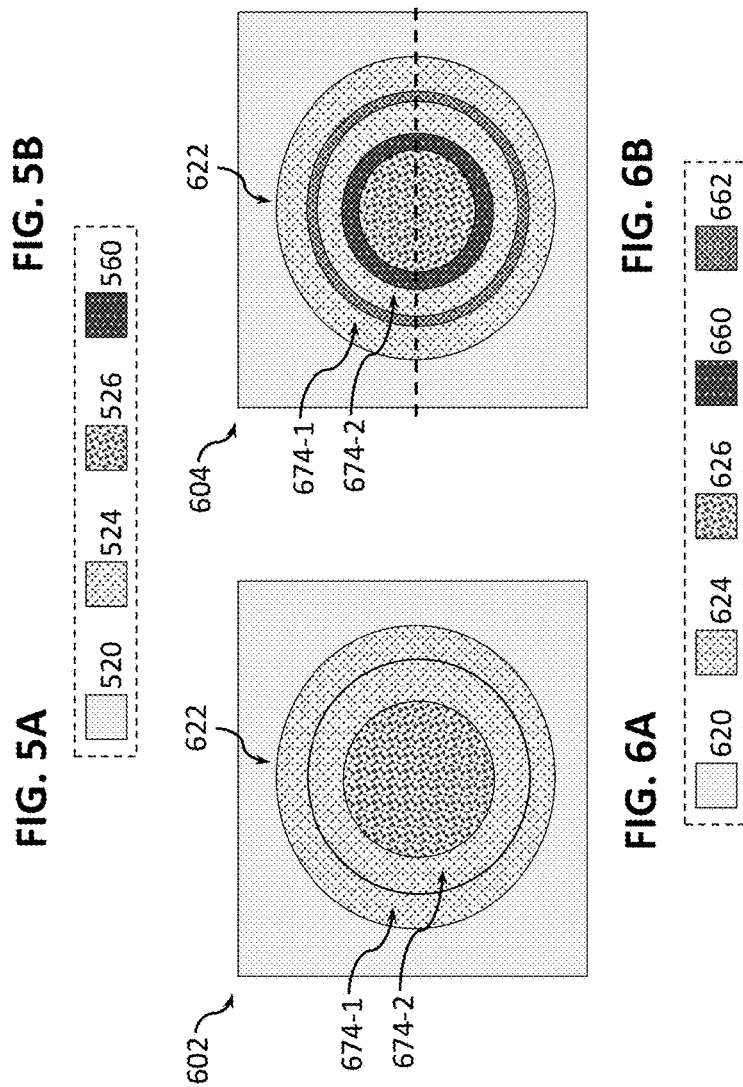

Case for liner and fill with dissimilar compositions

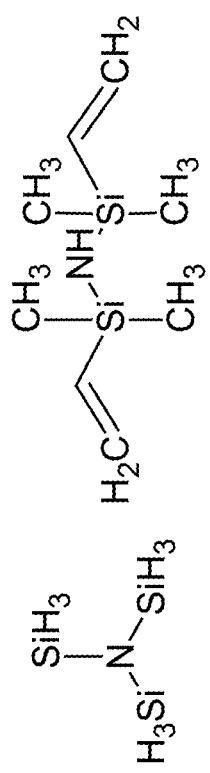
FIG. 12F
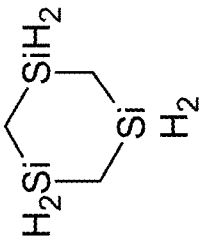
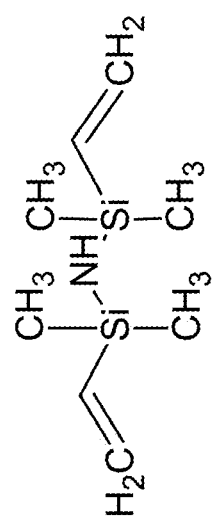
FIG. 12G
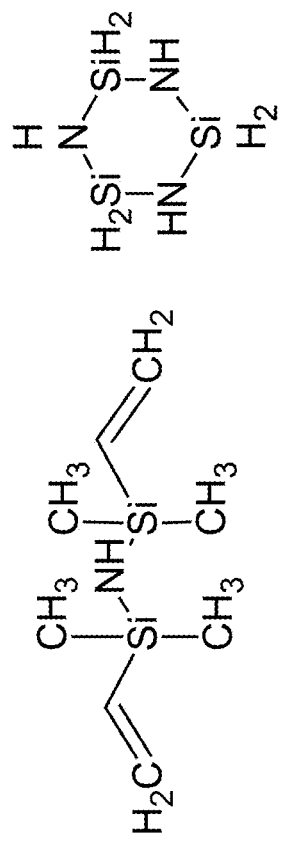
FIG. 12H

FILLING OPENINGS BY COMBINING NON-FLOWABLE AND FLOWABLE PROCESSES

CROSS-REFERENCE TO RELATED APPLICATION

This application is a national stage application under 35 U.S.C. § 371 of PCT International Application Serial No. PCT/US2017/053853, filed on Sep. 28, 2017 and entitled "FILLING OPENINGS BY COMBINING NON-FLOWABLE AND FLOWABLE PROCESSES," which is hereby incorporated by reference herein in its entirety.

TECHNICAL FIELD

This disclosure relates generally to the field of semiconductor device manufacturing, and more specifically, to techniques for filling openings by combining non-flowable and flowable processes in manufacturing integrated circuit components, and to related devices and systems.

BACKGROUND

For the past several decades, the scaling of features in integrated circuits (ICs) has been a driving force behind an ever-growing semiconductor industry. Scaling to smaller and smaller features enables increased densities of functional units on the limited area of semiconductor IC chips. For example, shrinking transistor size allows for the incorporation of an increased number of memory or logic devices on a chip, lending to fabrication of products with increased capacity. Since products that implement IC chips are used in a variety of devices including automobiles, computers, appliances, mobile phones and consumer electronics, increasing capacity of the chips is always desirable.

The drive for the ever-increasing capacity, however, is not without issue. The desire to make smaller IC chips continuously places demands on the methods and materials used to manufacture these devices. For example, integration of advanced backend interconnects of IC chips requires materials with unique compositions that can be deposited completely into openings/gaps without forming voids. In particular, there is a need for fabricating structures that include openings filled with dielectric materials which have specified properties desired for a given implementation, such as e.g. a certain dielectric constant, specific etch properties, low electrical leakage, and thermal stability. Unfortunately, fabricating such structures remains a challenge, especially when the openings have high aspect ratios often needed in manufacturing of various IC components.

BRIEF DESCRIPTION OF THE DRAWINGS

Embodiments will be readily understood by the following detailed description in conjunction with the accompanying drawings. To facilitate this description, like reference numerals designate like structural elements (e.g. the same, similar, or analogous elements) and, therefore, discussions of these elements provided with respect to one of the drawings are applicable to other drawings and, in the interests of brevity, are not repeated for each of the drawings separately. Embodiments are illustrated by way of example, and not by way of limitation, in the figures of the accompanying drawings.

FIGS. 4A-4E provide schematic illustrations of cross-sections showing various exemplary stages in the manufacture of a structure with openings filled with a dielectric material using the combination method of FIG. 3, in accordance with various embodiments of the present disclosure.

FIG. 4F illustrates schematic cross-sections of various assemblies in which an opening filled with a dielectric material using the combination method of FIG. 3 may be provided, in accordance with various embodiments of the present disclosure.

FIGS. 5A and 5B provide schematic illustrations of top views of a structure with an opening filled with a dielectric material using the combination method of FIG. 3 where the dielectric liner is deposited in a single cycle, in accordance with some embodiments of the present disclosure.

FIGS. 6A and 6B provide schematic illustrations of top views of a structure with an opening filled with a dielectric material using the combination method of FIG. 3 where the dielectric liner is deposited in multiple cycles, in accordance with some embodiments of the present disclosure.

FIGS. 12A-12H illustrate various precursors for use in providing the fill dielectric in a combination method described herein, in accordance with various embodiments of the present disclosure.

DETAILED DESCRIPTION

Figure 1A:
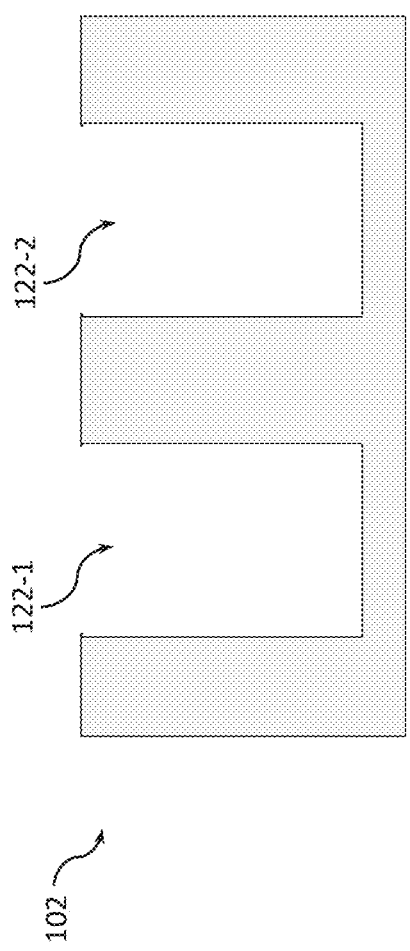
FIGS. 1A and 1B provide schematic illustrations of cross-sections showing various example stages in the manufacture of a structure with openings filled with a dielectric material using conventional methods.

Disclosed herein are methods for manufacturing IC components using bottom-up fill of openings with a dielectric material. In one aspect, an exemplary method includes, first, depositing a solid dielectric liner on the inner surfaces of the openings (i.e. lining the side walls and floors of the openings with a solid layer of dielectric liner), and subsequently filling the remaining empty volume of the openings with a flowable fill dielectric, followed by applying an excitation (i.e. applying a stimuli) to facilitate cross-linking of the flowable fill dielectric into a matrix (i.e. a three-dimensional (3D) network) of solid fill dielectric within the openings lined with the dielectric liner. In order to provide a solid dielectric liner only on the inner surfaces without completely filling the entire opening volume processes which result in direct formation/growth of a solid dielectric from fluid precursors are used, which processes may be referred to, in general, as "non-flowable" processes. On the other hand, in order to fill the remaining empty volume of the openings with a dielectric material processes which involve, first, partially cross-linking relatively low molecular weight (MW) precursors into larger-MW oligomers which can flow (i.e. move and fill into gaps), followed by applying an excitation to cross-link the larger-MW oligomers into a 3D network of a solid dielectric are used, which processes may be referred to, in general, as "flowable" processes. Because methods described herein combine the use of non-flowable and flowable processes, these methods are referred to herein as "combination" methods. Assemblies/structures and devices manufactured using such methods are disclosed as well, which assemblies and devices are referred to herein as having "openings filled with a dielectric material using a combination method" due to the combination methods used to form them.

In accordance with various aspects, the plurality of openings may include openings, holes, or gaps (all together referred to herein simply as "openings") of various aspect ratios, where, as used herein, "aspect ratio" (AR) refers to a ratio between a depth/height of an opening to a width of an opening. In various embodiments, openings described herein may have ARs between about 1 and 20, including all values and ranges therein, e.g. between about 4 and 20 or between about 6 and 15. In some implementations, dimensions of the openings may be on the nanometer scale, e.g. with a width of an opening being about 20 nm and a depth of an opening being about 120 nm, i.e. AR of 6. Therefore, such structures with openings may sometimes be described as "nanostructures" or "nanopatterned structures."

Reference to "a dielectric material" within the openings does not imply that only one type of dielectric material, e.g. silicon oxide, is provided within each opening. In fact, in various embodiments, "a dielectric material" within an opening may include two or more different dielectric materials.

The devices and assemblies having openings filled with a dielectric material using a combination method as described herein could be a part of a semiconductor device or an IC package, e.g. a part of an interconnect, e.g. a backend interconnect, used for providing electrical conductivity in a semiconductor device or an IC package. As used herein, the term "backend interconnect" is used to describe a region of an IC chip containing wiring between components associated with an IC, e.g. transistors, and other elements, while the term "frontend interconnect" is used to describe a region of an IC chip containing the rest of the wiring. Structures having openings filled with a dielectric material using a combination method as described herein may be used in any devices or assemblies where one electrically conductive element of the wiring needs to be separated from another electrically conductive element, which could be done both in backend and frontend interconnects. Such devices or assemblies would typically provide an electronic component, such as e.g. a transistor, a die, a sensor, a processing device, or a memory device, and one or more interconnects for providing electrical connectivity to the component. The interconnect(s) may include a plurality of conductive regions, e.g. trenches and/or vias filled with electrically conductive materials as known in the art. Another term commonly used in the art for a plurality of trenches and vias filled with electrically conductive materials is a "metallization stack." The devices and assemblies having openings filled with a dielectric material using a combination method as described herein could be used to electrically isolate at least some of the conductive regions from one another.

The devices and assemblies having openings filled with a dielectric material using a combination method as described herein may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

In the following detailed description, reference is made to the accompanying drawings that form a part hereof, and in which are shown, by way of illustration, embodiments that may be practiced.

In order to not clutter the drawings, some of the elements referred to in the description of various drawings with reference numerals may be indicated in the corresponding drawings with different patterns, with a legend showing the correspondence between the reference numerals and patterns being provided below the corresponding drawings, and are not labeled in these drawings with arrows pointing to them.

The accompanying drawings are not necessarily drawn to scale. For example, to clarify various layers, structures, and regions, the thickness of some layers may be enlarged.

Furthermore, while drawings illustrating various structures/assemblies of exemplary devices may be drawn with precise right angles and straight lines, real world process limitations may prevent implementations of devices exactly as shown. Therefore, it is understood that such drawings revised to reflect example real world process limitations, in that the features may not have precise right angles and straight lines, are within the scope of the present disclosure. Drawings revised in this manner may be more representative of real world structure/assemblies as may be seen on images using various characterization tools, such as e.g. scanning electron microscopy (SEM) or transmission electron microscopy (TEM). In addition, the various structures/assemblies of the present drawings may further include possible processing defects, such as e.g. the rounding of corners, the drooping of the layers/lines, unintentional gaps and/or discontinuities, unintentionally uneven surfaces and volumes, etc., although these possible processing defects may not be specifically shown in the drawings.

It is to be understood that other embodiments may be utilized and structural or logical changes to the drawings and descriptions may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The meaning of "a," "an," and "the" include plural references. The meaning of "in" includes "in" and "on."

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Furthermore, stating in the present disclosure that any part (e.g. a layer, film, area, or plate) is in any way positioned on or over (e.g. positioned on/over, provided on/over, located on/over, disposed on/over, formed on/over, etc.) another part means that the referenced part is either in contact with the other part, or that the referenced part is above the other part with one or more intermediate part(s) located therebetween. On the other hand, stating that any part is in contact with another part means that there is no intermediate part between the two parts.

The terms "substantially," "close," "approximately," "near," and "about," generally refer to being within +/−20% of a target value. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. In some examples, a "high-k dielectric" may refer to a material having a dielectric constant higher than that of silicon oxide, a "low-k dielectric" may refer to a material having a dielectric constant lower than that of silicon oxide, while the terms "oxide," "carbide," "nitride," etc. may refer to compounds containing, respectively, oxygen, carbon, nitrogen, etc. In another example, the term "connected" means a direct electrical or magnetic connection between the things that are connected, without any intermediary devices, while the term "coupled" means either a direct electrical or magnetic connection between the things that are connected or an indirect connection through one or more passive or active intermediary devices. The term "circuit" means one or more passive and/or active components that are arranged to cooperate with one another to provide a desired function.

For purposes of illustrating structures having openings filled with a dielectric material using a combination method as proposed herein, it is important to understand the phenomena that may come into play in a typical IC manufacturing process. The following foundational information may be viewed as a basis from which the present disclosure may be properly explained. Such information is offered for purposes of explanation only and, accordingly, should not be construed in any way to limit the broad scope of the present disclosure and its potential applications. For example, in the following, some descriptions are provided with reference to use of a trimethyl aluminum (TMA) precursor and a coreactant such as water to form a metal oxide as a solid dielectric liner provided in the openings in a non-flowable process, and some specific precursor combinations are described as precursors which may be used in flowable processes of the combination methods described herein. However, descriptions of various embodiments provided herein are equally applicable to using precursors and coreactants other than those described herein, and/or are applicable to forming dielectric materials other than metal oxides.

Figure 1B:
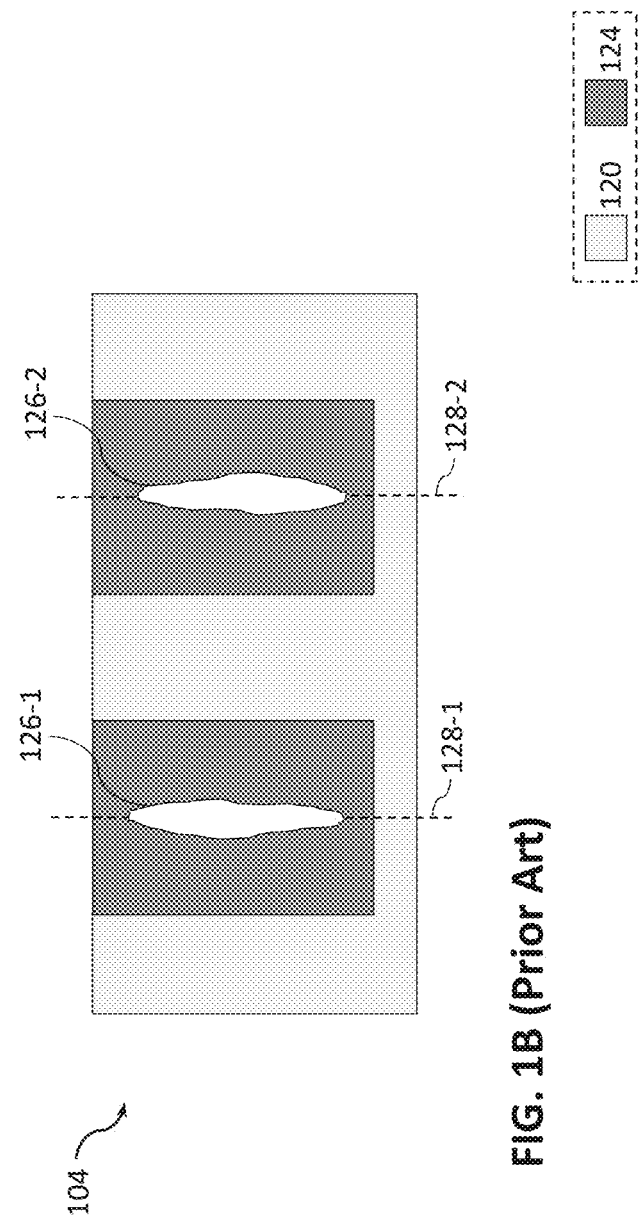

FIGS. 1A-1B are cross-sections illustrating various example stages in the manufacture of a structure with openings filled with a dielectric material using conventional methods.

FIG. 1A illustrates a structure 102 comprising a substrate 120 with two openings 122, indicated as a first opening 122-1 and a second opening 122-2. In IC component manufacturing, it may be necessary to fill the openings 122 with a dielectric material such as e.g. a silicon oxide, a silicon nitride, a silicon carbide, or a metal oxide. Such a dielectric material may later serve as e.g. an etch stop material with suitable etch selectivity and dielectric properties.

Oftentimes, atomic layer deposition (ALD) or chemical vapor deposition (CVD) processes are used to fill such openings with a dielectric material. In general, CVD or ALD is a chemical process in which one or more reactive precursor gases are introduced into a reaction chamber and directed towards a substrate in order to induce controlled chemical reactions that result in growth of a desired material on the substrate.

For example, an ALD process may be carried out by placing the structure 102 into a reaction chamber and introducing into the chamber a gaseous dielectric precursor such as e.g. TMA, as well as a co-reactant such as e.g. water. TMA and water will nucleate on the sidewalls of each of the openings 122 to form a dielectric material in the form of aluminum oxide, which oxide will then grow towards the center of the opening. This is an example of a non-flowable process and, in general, such non-flowable processes have notable strengths such as e.g. ability to carry out highly conformal deposition and ability to tune the cycles so that the material that coats the sidewalls has the same composition and property uniformity as the material that coats planar surfaces, as long as a minimum opening size is maintained. However, a major undesirable side effect of the nature of the dielectric growth in non-flowable processes (i.e. from the sidewalls towards the center), is that voids, i.e. areas within the openings where the dielectric material is absent, are often formed. Such a situation is illustrated in FIG. 1B showing a structure 104. The structure 104 is the same as the structure 102 but after a dielectric material 124, e.g. aluminum oxide, was grown by ALD within the openings 122. As illustrated in FIG. 1B, as a result of this ALD growth, a void 126 is formed within each of the openings 122 (shown in FIG. 1B as a void 126-1 within the opening 122-1 and a void 126-2 within the opening 122-2). The voids 126 are often located approximately along a centerline 128 of the openings (shown in FIG. 1B as a centerline 128-1 within the opening 122-1 and a centerline 128-2 within the opening 122-2).

Figure 2A:
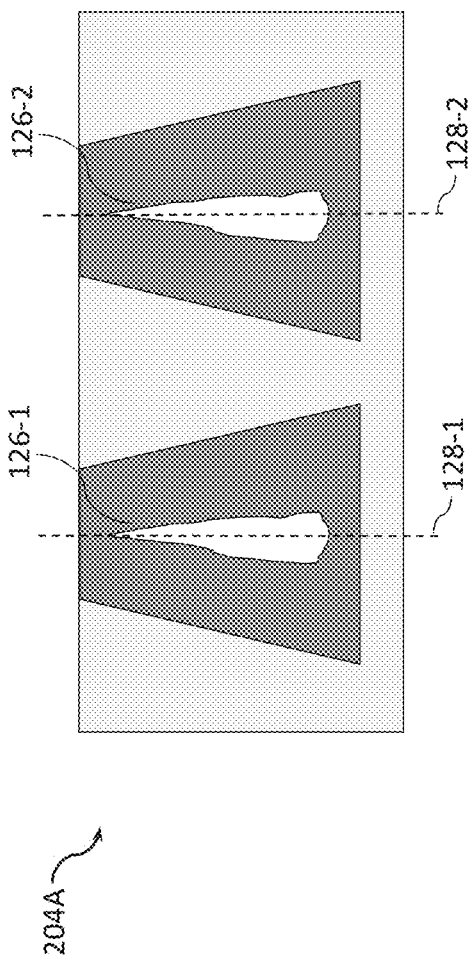
FIGS. 2A and 2B provide schematic illustrations of cross-sections showing a structure with openings filled with a dielectric material using conventional methods and having, respectively, a re-entrant profile and a non-re-entrant profile.
Figure 2B:
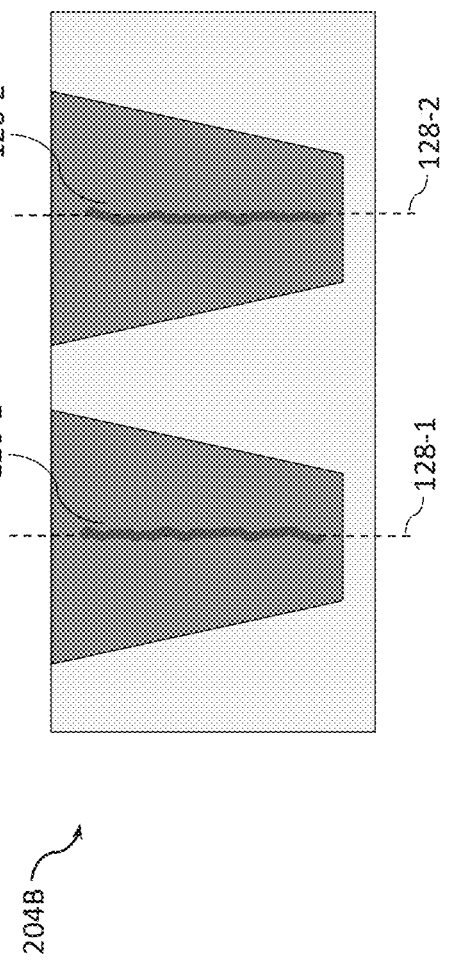

FIGS. 1A and 1B illustrate openings having a substantially straight profile, i.e. a profile where the openings have sidewalls extending perpendicularly from the surface. While such profiles are often desirable for various openings, they are not always achievable in real world manufacturing processes. Namely, a real world opening, although designed to have a straight profile, may end up having a so-called "re-entrant" profile, where the width at the top of the opening is smaller than the width at the bottom of the opening, or a so-called "non-re-entrant" profile, where the width at the top of the opening is larger than the width at the bottom of the opening. The nature of non-flowable dielectric growth within the openings would typically depend on the actual profile of the openings and may be different than that illustrated in FIG. 1B. For example, a void in the center may be substantially triangular in form, where the dielectric material pinches off at the top of a re-entrant profile opening as shown in FIG. 2A with a structure 204A having voids 126 in the dielectric material 124, or the dielectric material may form a seam substantially in the center of the opening, instead of a void, as shown in FIG. 2B with a structure 204B having seams 126.

All of the imperfections in the dielectric material within the openings (i.e. voids, seams, etc.) provided by non-flowable processes result in major yield issues during pattern transfer in subsequent IC manufacturing steps, with the problems only getting worse as, in order to accommodate IC manufacturing scaling trends, dimensions of the openings shrink and ARs of the openings get higher. Therefore, flowable processes have also been explored in filling openings with dielectric materials, where, typically, low-MW monomers or small oligomers are used as fluid precursors provided onto a substrate with openings (using e.g. flowable CVD (FCVD), spin-coating, or dip-coating). In contrast to non-flowable processes, precursors used in flowable processes are such that, due to their liquid state, they can fill into patterned openings and only cross-link into a solid matrix of dielectric material when sufficient excitation/shock is provided, e.g. in the form of high temperatures, plasma, and/or radiation (e.g. ultraviolet (UV) radiation). Therefore, once provided on the substrate, the precursors first flow and fill the openings, and are only set into a solid dielectric once a further excitation is provided to cross-link the larger-MW oligomers into a 3D network of a solid dielectric. Furthermore, once the flowable precursors are set into a solid cross-linked network, the wafers are often subjected to higher temperature outgassing bakes, e.g. bakes at about 400-500 degrees Celsius for 1-30 minutes, in order to remove any thermally labile species. As used herein, the term "outgassing" is used to describe release of gases that may have been dissolved, trapped, absorbed, or otherwise included within the cross-linked dielectric material. In addition to outgassing, final stages of flowable processes also often include cures e.g. by using heat, UV photons/radiation, plasma, or/and electron beams, in order to mechanically harden and/or change the etch properties of the final dielectric material.

While flowable processes have advantages over non-flowable processes, most notably the ability to fill high AR openings, narrow gaps, re-entrant profiles, and even lateral features without seams and voids, they have their own issues as well. One issue is that some precursors require such high temperatures and long anneal times in reactive environments in order to generate thermodynamically and mechanically stable films that undesired oxidation of the underlying substrate, or undesired other reactions, may take place. In addition, the often needed cures and anneals require precise tuning to avoid compositional and property gradients through the thickness of the resulting dielectric films, and the extent of curing times required in the process is dependent on the volume/amount of the material in the feature and the overburden.

Embodiments of the present disclosure aim to improve on one or more shortcomings of conventional techniques for providing dielectric materials in openings, especially relatively high AR openings, described above. To that end, a combination method is proposed, where, first, a non-flowable process is used to grow a solid dielectric liner on the inner surfaces of the openings, and, next, a flowable process is used to fill the remaining empty volume of the openings with a fill dielectric. Such a combination method aims to maximize the individual strengths of the non-flowable and flowable processes due to the synergetic effect achieved by their combined use, while reducing their respective drawbacks.

Some advantages of the disclosed combination method may include that relatively high AR structures, e.g. structures having an AR of at least 3, e.g. an AR of about 6, 10, or even greater, may be filled with dielectric materials in a manner that does not result in formation of voids or seams while, at the same time, mitigating the challenges associated with the use of high temperature treatments. Namely, the dielectric liner can act as a buffer to protect the underlying substrate from undesirable chemical reactions while the flowable fill dielectric is subject to high temperature treatments.

In various embodiments, each of the solid dielectric liner and the fill dielectric may include one or more dielectric materials, and, overall, the solid dielectric liner and the fill dielectric may be the same type of dielectric materials (e.g. both can be a specific type of oxide, e.g. both can be silicon oxide) or different types of dielectric materials (e.g. the dielectric liner can be a silicon nitride while the fill dielectric can be a silicon oxide or silicon oxynitride). Using the same types of dielectric materials may allow creating a more uniform or/and more dense dielectric fill within the openings, while using different dielectric materials may allow creating hybrid materials with improved etch performance and/or carefully controlled dielectric properties. Overall, the techniques proposed herein may enable manufacturing devices having improved performance and using a wider array of materials, compared to what is realizable using conventional approaches.

Figure 3:
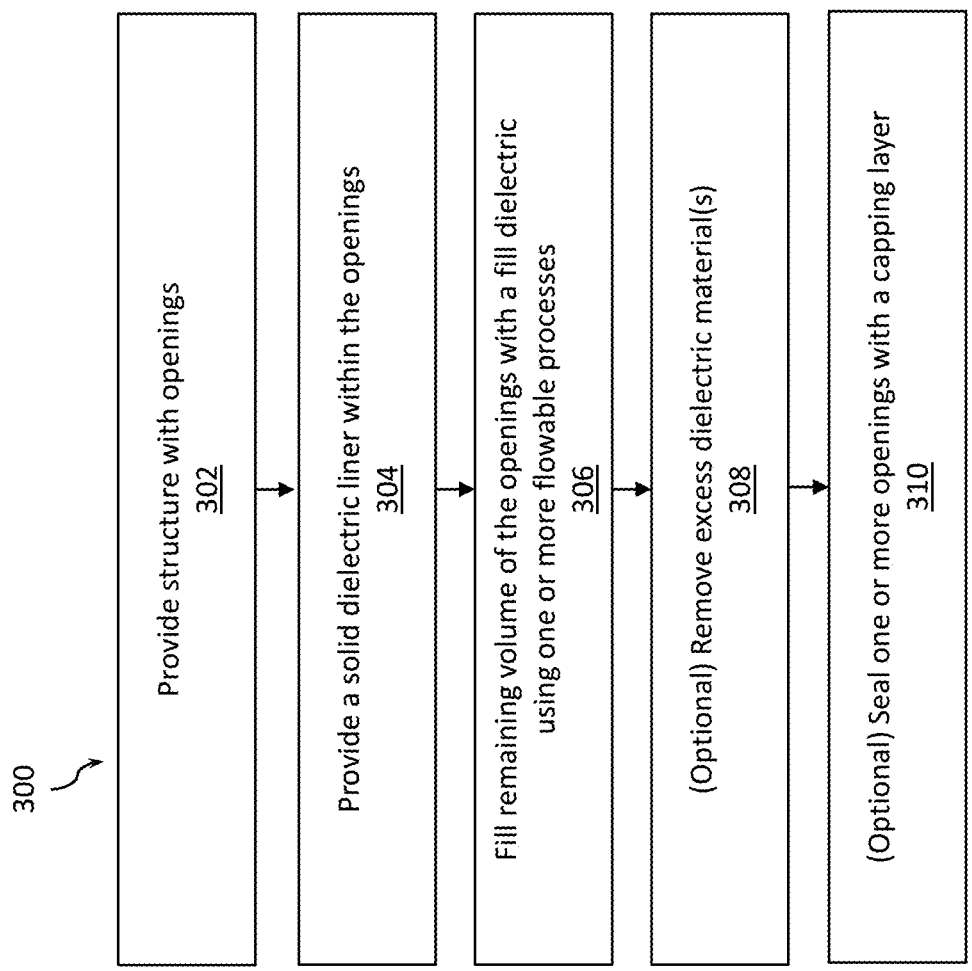
FIG. 3 is a flow diagram of an exemplary method of manufacturing a structure with one or more openings filled with a dielectric material by combining non-flowable and flowable processes, in accordance with various embodiments of the present disclosure.

FIG. 3 is a flow diagram of an exemplary method 300 of manufacturing a structure with one or more openings filled with a dielectric material by combining non-flowable and flowable processes, in accordance with various embodiments of the present disclosure. FIGS. 4A-4E are cross-sections illustrating various exemplary stages in the manufacture of a structure with openings filled with a dielectric material using the combination method 300 as shown in FIG. 3, in accordance with various embodiments of the present disclosure.

Although the operations of the method 300 are illustrated in FIG. 3 once each and in a particular order, the operations may be performed in any suitable order and repeated as desired. For example, one or more operations may be performed in parallel to manufacture multiple structures having openings filled with a dielectric material using a combination method substantially simultaneously. In another example, the operations may be performed in a different order to reflect the architecture of a particular IC component in which one or more structures having openings filled with a dielectric material using a combination method are to be included.

In addition, the manufacturing method 300 may include other operations, not specifically shown in FIG. 3, such as e.g. various cleaning operations as known in the art. For example, in some embodiments, the structures may be cleaned prior to or/and after any of the processes of the method 300 described herein, e.g. to remove surface-bound organic and metallic contaminants, as well as subsurface contamination. In some embodiments, cleaning may be carried out using e.g. chemical solutions (such as peroxide), and/or with UV radiation combined with ozone, and/or oxidizing the surface (e.g., using thermal oxidation) then removing the oxide (e.g. using hydrofluoric acid (HF)).

Implementations of the present disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

As described above, in various embodiments, the structures having openings filled with a dielectric material using a combination method as described herein may be used to connect various components associated with an integrated circuit. In the embodiments where at least some of the components associated with an integrated circuit are transistors, a plurality of transistors, such as metal-oxide-semiconductor field-effect transistors (MOSFET or simply MOS transistors), may be fabricated on the substrate. In various implementations of the disclosure, the MOS transistors may be planar transistors, non-planar transistors, or a combination of both.

Referring to FIG. 3, the method 300 may begin with a process 302 where a structure with one or more openings is provided. An example of such a structure is a structure 402 shown in FIG. 4A.

As shown in FIG. 4A, the structure 402 includes what is referred to herein as a "gapfill base layer" 420 because this is a layer in which one or more openings (gaps) to be filled with one or more dielectric materials using the combination approach described herein are provided. An example of FIG. 4A illustrates two openings 422, indicated as a first opening 422-1 and a second opening 422-2, formed within the gapfill base layer 420. The openings 422 within the gapfill base layer 420 are to be filled with one or more dielectric materials using the combination approach described herein.

In general, the structure resulting from the process 302 may be provided over any of the substrates described herein.

In some embodiments, the gapfill base layer 420 may be a layer of one or more electrically conductive materials which may e.g. be a part of a metallization stack in an IC die. Such a layer of one or more electrically conductive materials may be a patterned layer, e.g. a layer in which one or more trenches are formed, e.g. if the structure is a part of a metallization stack.

In some embodiments, the gapfill base layer 420 may be a layer of one or more dielectric material(s). Providing the openings 422 filled with a dielectric material different from those of the surrounding layer (i.e. different from those of the gapfill base layer 420) may be useful in scenarios where providing regions of dielectric materials with sufficient etch selectivity is desired, i.e. the dielectric material of the opening 422 would not be substantially etched when etchants which can etch the dielectric material of the surrounding dielectric gapfill base layer 420 are used, or/and vice versa.

Some examples of devices/assemblies where the opening 422 filled with one or more dielectric materials as described herein may be provided are shown in FIG. 4F, described below.

It should be noted that, in various embodiments, the structures as shown in FIGS. 4A-4F may include additional layers below the views shown in FIGS. 4A-4F, such as e.g. layers below the gapfill layer 420 which may have other features (e.g. additional metallization layers) or a carrier substrate commonly used to provide mechanical support during manufacture (e.g., a metal sheet, a dielectric material, or a reinforced dielectric material).

In some embodiments, each of the openings 422 may have an AR between about 1 and 100, including all values and ranges therein, such as e.g. between about 1 and 15 or between about 5 and 20, preferably greater than about 3. In some embodiments, each of the openings 422 may have a depth between about 5 and 100 nm, including all values and ranges therein, such as e.g. between about 10 and 80 nm or between about 20 and 50 nm. In some embodiments, each of the openings 422 may have a width between about 1 nm and several micrometers (microns), including all values and ranges therein, such as e.g. between about 5 and 500 nm or between about 5 and 50 nm.

In some embodiments, more than two openings 422 may be provided within the gapfill base layer 420 provided at 302, the openings 422 having a pitch (i.e. a center-to-center distance between a pair of two adjacent openings) between e.g. about 10 and 200 nm, including all values and ranges therein. In other embodiments, any other patterns of openings 422 may be used as well. In still other embodiments, the structure 402 may include any other number of one or more openings, different instances of which openings may but do not have to have the same shape and/or dimensions.

The method 300 may then proceed with a process 304, where the openings 422 are lined with a solid dielectric liner material. A result of this is shown in FIG. 4B with a structure 404 which illustrates that the openings 422 in the gapfill base layer 420 are now conformally coated (i.e. all exposed surfaces of the structure 402 are coated, including sidewalls and bottoms of the openings 422 as well as the upper surface of the structure 402) with a solid dielectric liner material 424.

Any of the suitable non-flowable processes may be used in the process 304, such as e.g. ALD, Plasma Enhanced ALD (PE-ALD), CVD, or PE-CVD using precursors which result in a conformal growth of the dielectric liner 424 on the sidewalls and floors of the openings 422. To that end, one or more reactive dielectric precursor fluids (e.g. gases) may be introduced into a reaction chamber and directed towards a substrate, e.g. towards the structure 402, in order to induce controlled chemical reactions that result in growth of the dielectric material 424 on the exposed surfaces of the structure 402. In some embodiments, co-reactants such as e.g. water or isopropanol may also be provided during the ALD/CVD processes in order to promote nucleation of the dielectric material on the exposed surfaces of the structure 402.

The choice of the dielectric precursors and, possibly co-reactants, used in the non-flowable ALD/CVD processes carried out at 304 would depend on the dielectric liner 424 which is to be grown in the openings 422. For example, in case the dielectric liner 424 is a carbon doped silicon nitride, precursors may include Bis(tertiary-butylamino)silane or Bis(diethylamino)silane (BDEAS) and nitrogen and hydrogen containing plasma. In another example, in case the dielectric liner 424 is a metal oxide in the form of aluminum oxide, the precursors used at 304 may include TMA and a co-reactant such as e.g. water or isopropanol. If the dielectric liner 424 is hafnium oxide, the precursors used at 304 may include (ethylmethylamino) hafnium (Hf-EMA), e.g. tetrakis (ethylmethylamino) hafnium (Hf(EMA)4) or/and hafnium chloride, e.g. hafnium tetrachloride (HfCl4), and a co-reactant such as e.g. water or isopropanol. If the dielectric liner 424 is titanium oxide, the precursors used at 304 may include titanium chloride, e.g. titanium tetrachloride (TiCl4), and a co-reactant such as e.g. water or alcohols such as ethanol or isopropanol or gases such as silane, ammonia, hydrogen. In general, a suitable co-reactant which may be used with any of the above-mentioned dielectric precursors may be a compound that converts the metal containing precursor into the corresponding metal oxide or nitride.

The solid dielectric liner 424 may be grown in the process 304 for any suitable time and may include multiple deposition cycles of one or more non-flowable processes, as long as the dielectric liner 424 does not close the openings 422 and as long as, in general, the openings 422 remain open enough so that a flowable dielectric precursor can be filled into the openings in the subsequent fabrication process. In some embodiments, the dielectric liner may occupy between about 1 and 90% of a volume of each of the plurality of openings, including all values and ranges therein. For example, in various embodiments, the dielectric liner may occupy between about 2% and 98% of the volume of each opening or between about 2% and 90% of the volume. A thickness of the dielectric liner may range from a few to hundreds of atomic layers, e.g. may be between about 50 nm and 100 nm, including all values and ranges therein, e.g. between about 30 nm and 50 nm, or between about 10 and 30 nm, or between about 1 nm and 10 nm, as long as the openings 422 remain sufficiently open for the fill of the flowable fill dielectric in a subsequent process.

Once the openings 422 are coated with the dielectric liner 424, the method 300 may proceed with a process 306 shown in FIG. 3, where the remaining open volume of the openings 422 is filled with a dielectric material using one or more flowable processes. A result of this is shown in FIG. 4C with a structure 406 which illustrates that the openings 422 lined with the dielectric liner 424 are now filled with a fill dielectric 426.

In some embodiments, filling the lined openings 422 with the fill dielectric 426 in the process 306 may include providing gaseous precursors using a flowable CVD process where, first, precursors are directed onto the structure 406 in a CVD chamber where they react to form a flowable fill dielectric which can fill the remaining volume of the openings 422, followed by applying an excitation to facilitate cross-linking of the compounds of the flowable fill dielectric into a solid matrix of the fill dielectric 426, now set in the openings 422.

As an alternative to the flowable processes described above where dielectric precursors are provided as gases, formation of the fill dielectric 426 at 306 can also happen in a solution phase (i.e. the dielectric precursors may be liquid). Examples of such flowable processes include processes relying on sol-gel reactions involving the reaction of metal alkoxides, such as e.g. hafnium ispropoxide, metal nitrates, such as e.g. aluminum nitrates, and a suitable co-reactant such as e.g. water or ethanol, and, possibly, an appropriate thermal treatment. In such scenarios, the liquid dielectric precursors may be provided by spin-coating or dip-coating on the structure with the openings lined with the dielectric liner, such as e.g. the structure 404, where spin-coating or dip-coating is performed as known in the art. For example, for spin-coating, spin speed of about 100-5000 revolutions per minute may be used, with the spin time of about 10-300 seconds. Examples of the fill dielectric materials 426 which may be formed by sol-gel processes include, but are not limited to, cerium oxide, iron oxide, hafnium oxide, titanium oxide, copper oxide, and aluminum oxide. In such processes, a dielectric precursor may be the sol (monomer) that has low viscosity and can permeate into the remaining open volume of the openings 422 of the structure 404, and the gel forms when the co-reactant cross links the sol to form a metal oxide polymer. In some embodiments, a suitable excitation, such as e.g. a thermal treatment or a thermal treatment successively or concurrently combined with UV-light treatment may be used to convert the gel into a solid 3D network of the fill dielectric 426. Additional examples of precursors and precursor combinations which may be used at 306 to provide the solid fill dielectric 426 are described in greater detail below.

In some embodiments, filling the remaining volume of the openings 422 with the flowable fill dielectric may include heating up one or more liquid precursors for the flowable fill dielectric to a temperature above a glass transition temperature (Tg) of such precursors in order to allow complete and uniform flow of the precursors into the openings 422. To that end, in some embodiments, the structure 404 filled with flowable dielectric fill precursors may be heated up to about 125 degrees Celsius for about 5 minutes. A person of ordinary skill in the art would readily recognize that different molecular weight species can provide different Tg values and, therefore, different temperatures need to be applied for controlling the flow heating process.

In various embodiments of the present disclosure, applying the excitation to cross-link the fluid precursors into the solid fill dielectric 426 at 306 may include baking the structure at a temperature above about 200 degrees Celsius, e.g. above about 300 degrees Celsius or above about 350 degrees Celcius, which baking may be carried out for e.g. about 5 to 60 minutes. However, in general, in various embodiments, the excitation used in a flowable process of 306 may include any one or more types of excitation, such as e.g. thermal excitation, optical excitation (e.g. illuminating the structure with UV radiation), chemical excitation, X-ray excitation, electron-beam excitation, plasma treatment etc., suitable for cross-linking a flowable fill dielectric in the openings 422 into a 3D matrix of the solid fill dielectric 426.

In some embodiments, filling the remaining volume of the openings 422 at the process 306 of FIG. 3 may include performing an outgassing of the resulting solid fill dielectric 426. For example, such outgassing may include baking the structure 406 at about 400 to 450 degrees Celsius for about 1 to 30 minutes.

In some embodiments, the flowable process of 306 may also include curing the solid fill dielectric 426. Such curing may, for example, be performed by heating the structure 406 to temperatures between about 200-450 degrees Celsius while simultaneously exposing the solid fill dielectric to optical radiation of e.g. 170-254 nanometer wavelengths or to charged particles, e.g. electrons. In some embodiments, it may also include exposure of the solid fill dielectric to water or other liquid crosslinking agent.

In some embodiments, the method 300 may stop once the openings 422 have been filled with the fill dielectric 426. In other embodiments, the method 300 may proceed with an optional process 308 where the layers of the fill dielectric 426 and the dielectric liner 424 deposited on the upper surfaces of a structure with openings (i.e. beyond the openings 422) are removed to expose the upper surfaces of the gapfill material 420. A result of this is shown in FIG. 4D with a structure 408 which illustrates that upper portions of the dielectric liner 424 and the fill dielectric 426 deposited on the upper surfaces 428 of the gapfill material 420 are removed to expose these surfaces. In some embodiments, removing the dielectric liner 424 and the fill dielectric 426 to expose the upper surfaces 428 may include etching or ashing the dielectric materials of the dielectric liner 424 and the fill dielectric 426 using an appropriate etchant or ashing process, as known in the art.

In some embodiments, the method 300 may also include an optional process 310, where the one or more openings 422 may be sealed with a capping layer once the desired dielectric material (i.e. filled with the dielectric liner 424 and the fill dielectric 426) has been provided therein. A result of this is shown in FIG. 4E with a structure 410 which illustrates a capping layer 430 provided over the dielectric material(s) within the openings 422.

In some embodiments, the capping layer material 430 may advantageously be a different dielectric material than that of any of the dielectric materials provided within the openings 422 as described above, which may be attractive for applications where e.g. different dielectric properties are desirable for the capping layer 430 and the dielectric material filling the openings 422. For example, the capping material 430 may have improved (enhanced) etch resistance compared to the dielectric material within the openings 422, and may act as an etch stop to certain etchants. Such a capping material may e.g. include hafnium oxide, while the dielectric material within the openings (i.e. the dielectric liner 424 and/or the fill dielectric 426) may e.g. be aluminum oxide. While aluminum oxide may advantageously have relatively low dielectric constant, it may have poor etch resistance to certain commonly used etchants. By providing a hafnium oxide capping layer 430, enhanced etch resistance may be achieved over the dielectric material in the openings 422, while advantageously preserving the relatively low dielectric constant of the dielectric material in these openings. In other words, providing such a capping layer allows benefiting from the improved etch resistance without the associated high dielectric constant of the openings being filled with the material of the capping layer.

As previously described herein, the devices and assemblies utilizing structures having openings filled with a dielectric material using the combination method as described herein could be a part of a semiconductor device or an IC package, e.g. a part of an interconnect, e.g. a backend interconnect, in a semiconductor device or an IC package, and/or could be used to electrically isolate different electrically conductive regions from one another.

In one example, one or more of the openings 422 filled with dielectric materials may be used as so-called "plugs" commonly employed in metallization stacks, where a plug refers to a region in a metallization stack (e.g. a region cut out in a trench or between two trenches) where the electrically conductive material (e.g. any one of suitable metals commonly used in metallization stacks) of a given trench is removed and a dielectric material is filled in instead. Such a scenario is illustrated with a structure 452 of FIG. 4F, showing the opening 422 (which opening is filled with one or more dielectric materials in accordance with any of the embodiments described herein) being provided as a cut/plug in a first trench 432 (i.e. in this situation the gapfill base layer 420 described herein refers to the material of the trench 432 formed on a substrate).

In another example, one or more of the openings 422 may be created in a layer of an electrically conductive material as a part of patterning the layer to form trenches, where the dielectric material filled in such openings may serve to provide electrical isolation between different trenches. Such a scenario is illustrated with a structure 454 of FIG. 4F, showing the opening 422 (which opening is filled with one or more dielectric materials in accordance with any of the embodiments described herein) being provided to separate a first trench 434 from a second trench 436 (i.e. in this situation the gapfill base layer 420 described herein refers to the material(s) of the first trench 434 and the second trench 436, where, for ease of fabrication, the materials of the first and second trenches may typically, but not necessarily, be the same conductive materials formed on a substrate).

In yet another example, the one or more openings 422 may be created in a layer of a dielectric material provided over a layer that contains one or more trenches, where the dielectric material filled in such openings may serve to cap the trenches. Such a scenario is illustrated with a structure 456 of FIG. 4F, showing a trench layer 438 comprising a trench 440, and a dielectric layer 442 provided over the trench layer 438, where the opening 422 (which opening is filled with one or more dielectric materials in accordance with any of the embodiments described herein) is provided in the dielectric layer 442 to effectively cap the trench 440 (i.e. in this situation the gapfill base layer 420 described herein refers to the material of the dielectric layer 442 provided above the trench layer 440). Providing the opening 422 filled with a dielectric material that has sufficient etch selectivity compared to the material of the surrounding dielectric layer 442 may be used to make an electrical connection to the trench 440 by etching the dielectric material of the opening 422 without substantially etching the material of the dielectric layer 442. This is advantageous because, otherwise, etching a dielectric material covering the trench layer to expose and make a contact to the trench 440 may result in accidentally exposing and contacting other trenches which may be present within the trench layer 438 (such other trenches not specifically shown in the structure 456), a problem commonly described in the art as a "contact edge placement error" (i.e. misalignment resulting in electrical short between a via or contact and wrong metal trench/via).

In various embodiments, the use of the combination method as described herein may be detected by examining cross-sections of the final structures using e.g. TEM or SEM, and/or by performing a compositional analysis of the final structures because an interface between the dielectric liner 424 deposited using one or more non-flowable processes and the fill dielectric 426 deposited using one or more flowable processes may be clearly detectable, even if the bulk materials used for the dielectric liner 424 and the fill dielectric 426 are the same. This will be explained below with reference to FIGS. 5A-5B and FIGS. 6A-6B showing schematic illustrations of top views of various structures with openings filled with a dielectric material using the combination method of FIG. 3, and with reference to FIGS. 7-9 providing illustrations of compositional analysis performed for different exemplary scenarios of structures where an opening is filled with the dielectric liner and the fill dielectric as described herein.

FIGS. 5A and 5B provide schematic illustrations of top views of a structure with an opening filled with a dielectric material using the combination method of FIG. 3 where the dielectric liner is deposited in a single cycle, in accordance with some embodiments of the present disclosure. FIG. 5A illustrates a structure 502 having an opening 522 where the sidewalls of the opening 522 are lined with a dielectric liner 524 and the remaining volume of the opening 522 is filled with a fill dielectric 526. The structure 502 may be seen as a top view of a part of the structure 408, where the opening 522 is one of the two openings shown in the structure 408, the dielectric liner 524 is analogous to the dielectric liner 424 described above and the fill dielectric 526 is analogous to the fill dielectric 426 described above, which descriptions are applicable to FIG. 5A but, in the interests of brevity, are not repeated. The view shown in FIG. 5A is more of an idealized view showing a clear separation between the dielectric liner 524 and the fill dielectric 526. In real-world scenarios, oftentimes an interfacial region between these two dielectric will be noticeable, shown as an interface layer region 560 in the illustration of FIG. 5B.

FIG. 5B provides a schematic illustration of a top view of a structure 504, which is substantially the same as the structure 502 (which descriptions, therefore, are not repeated in the interests of brevity) except that the interface layer region 560 is explicitly shown between a liner layer region of the dielectric liner 524 and a center region of the fill dielectric 526. If the dielectric liner 524 and the fill dielectric 526 are deliberately selected to be different dielectric materials, then the compositional analysis will reveal that atomic percentages of various chemical elements will exhibit noticeable jump from the dielectric liner 524 to the dielectric material of the interface layer region 560, and from the interface layer region 560 to the fill dielectric 526, due to the material differences between the dielectric liner 524 and the fill dielectric 526, as described in greater detail below with reference to a compositional analysis shown in FIG. 7. However, even if the dielectric liner 524 and the fill dielectric 526 are intended to be substantially the same dielectric materials, then the compositional analysis will still reveal that atomic percentages of various chemical elements will exhibit a noticeable change from the dielectric liner 524 to the dielectric material of the interface layer region 560, and from the interface layer region 560 to the fill dielectric 526, already because the deposition methods of the dielectric liner 524 and the fill dielectric 526 are different, as described in greater detail below with reference to a compositional analysis shown in FIG. 8. As shown in FIG. 5B, the dielectric liner 524 of the liner layer region extends from the sidewalls of the opening 522 towards the center of the opening, while the fill dielectric 526 is provided substantially in the center of the opening 522 (i.e. in a center region of the opening), with the interface layer region 560 being encompasses by the dielectric liner 524 and encompassing the center region of the fill dielectric 526. Besides the compositional analysis, the interface layer region 560 may also be noticeable in SEM and TEM images of a cross sections of the real-world structures with openings filled with a dielectric material according to the combination method as described herein.

In some embodiments, additional interfaces may be present and detectable within openings filled with a dielectric material using the combination method as described herein. One example of such additional interfaces would be embodiments where the dielectric liner as described herein is deposited in multiple cycles, as illustrated in FIGS. 6A and 6B.

FIG. 6A illustrates a structure 602 having an opening 622 where the sidewalls of the opening 622 are lined with a dielectric liner 624 and the remaining volume of the opening 622 is filled with a fill dielectric 626. Similar to the structure 502 of FIG. 5A, the structure 602 may be seen as a top view of a part of the structure 408, where the opening 622 is one of the two openings shown in the structure 408, the dielectric liner 624 is analogous to the dielectric liner 424 described above and the fill dielectric 626 is analogous to the fill dielectric 426 described above, which descriptions are applicable to FIG. 6A but, in the interests of brevity, are not repeated. In contrast to the structure 502 shown in FIG. 5A, the structure 602 shown in FIG. 6A explicitly illustrates that the dielectric liner 624 is deposited in multiple cycles, namely in the example of FIG. 6A—in two cycles, having a first portion 674-1 deposited in the first cycle and a second portion 674-2 deposited in the second cycle. The view shown in FIG. 6A is more of an idealized view showing a clear separation between the first and second portions of the dielectric liner 624 and the fill dielectric 526. However, as described above, in real-world scenarios, oftentimes an interfacial region between these two dielectric will be noticeable, as shown in the illustration of FIG. 6B.

Figure 9:
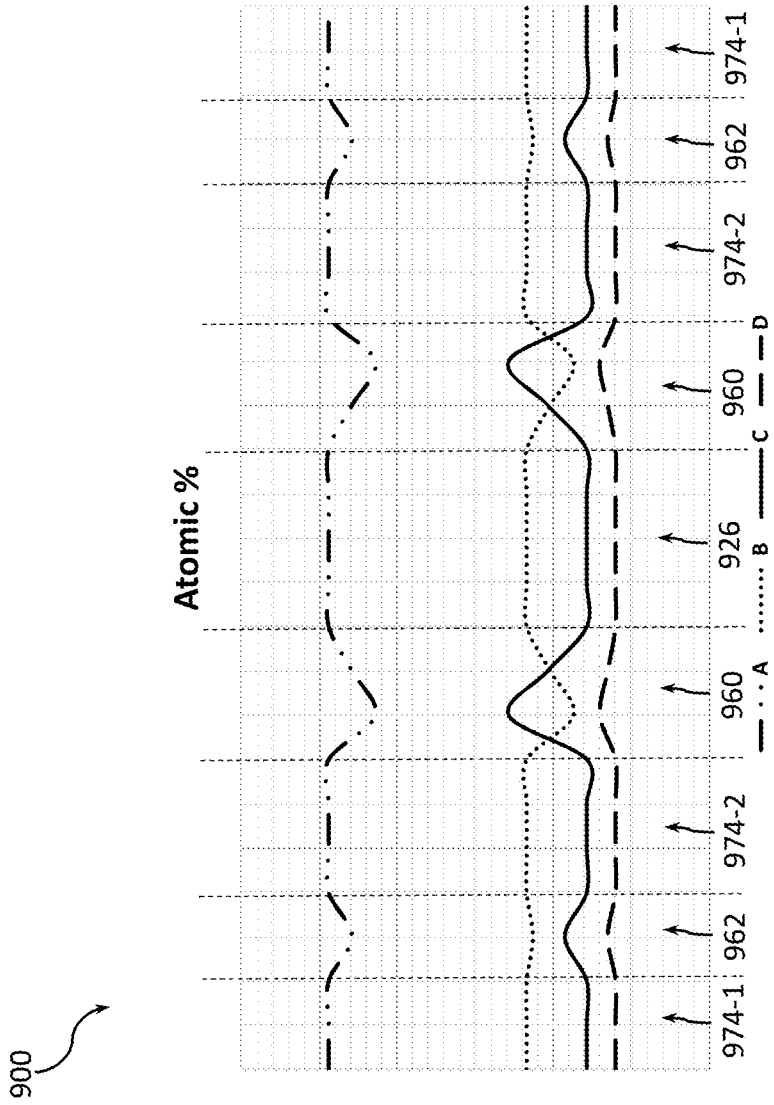
FIG. 9 illustrates differences in atomic composition of a dielectric material in different portions of a cross-section of an opening filled using a combination method described herein in an exemplary case where same or similar compositions for dielectric liner and fill dielectric materials are used and dielectric liner is deposited in multiple cycles, in accordance with some embodiments of the present disclosure.

FIG. 6B provides a schematic illustration of a top view of a structure 604, which is substantially the same as the structure 602 (which descriptions, therefore, are not repeated in the interests of brevity) except that the interface layer region 660 is explicitly shown between a liner layer region of the dielectric liner 624 and a center region of the fill dielectric 626. The interface layer region 660 is analogous to the interface layer region 560 shown in FIG. 5B, which descriptions, therefore, are not repeated in the interests of brevity. The structure 604 of FIG. 6B further illustrates a second interface layer region, shown as a region 662, between the first portion 674-1 of the dielectric liner 624 deposited in the first cycle and the second portion 674-2 of the dielectric liner 624 deposited in the second cycle. Even though the dielectric material of the dielectric liner 624 is intended to be the same material deposited in different cycles of a non-flowable deposition process, such as e.g. an ALD process, compositional changes may be observable in the atomic percentages of certain chemical elements of the dielectric material between the bulk portions of the dielectric liner 624 and the second interface layer region 662, as described in greater detail below with reference to a compositional analysis shown in FIG. 9. As shown in FIG. 6B, the dielectric liner material of the first liner layer region 674-1 extends from the sidewalls of the opening 622 towards the center of the opening and encompasses the dielectric liner material of the second liner layer region 674-2 with the second interface layer region 662 separating the two. Furthermore, similar to FIG. 5B, the dielectric liner material of the second liner layer region 674-2 encompasses the center region of the fill dielectric 626 substantially in the center of the opening, with the first interface layer region 660 separating the two. Besides the compositional analysis as shown in FIG. 9, the interface layer regions 660 and 662 may also be noticeable in SEM and TEM images of a cross sections of the real-world structures with openings filled with a dielectric material according to the combination method as described herein.

It should be noted that, while FIG. 6B illustrates that the first and second portions 674-1 and 674-2 both include the same dielectric liner material 624, in other embodiments, the composition method described herein may involve depositing different solid dielectric liners in different cycles. In other words, the first portion 674-1 may include a first dielectric liner material, while the second portion 674-2 may include a second dielectric liner material, different from the first dielectric liner material, with the fill dielectric material occupying substantially the remaining portion of the volume of the opening.

Furthermore, while FIGS. 5A-5B and FIGS. 6A-6B illustrate substantially circular top view cross-sections of openings, in general, openings filled with a dielectric material using the combination method as described herein may have any shape/geometry and are not limited to substantially circular openings.

Figure 7:
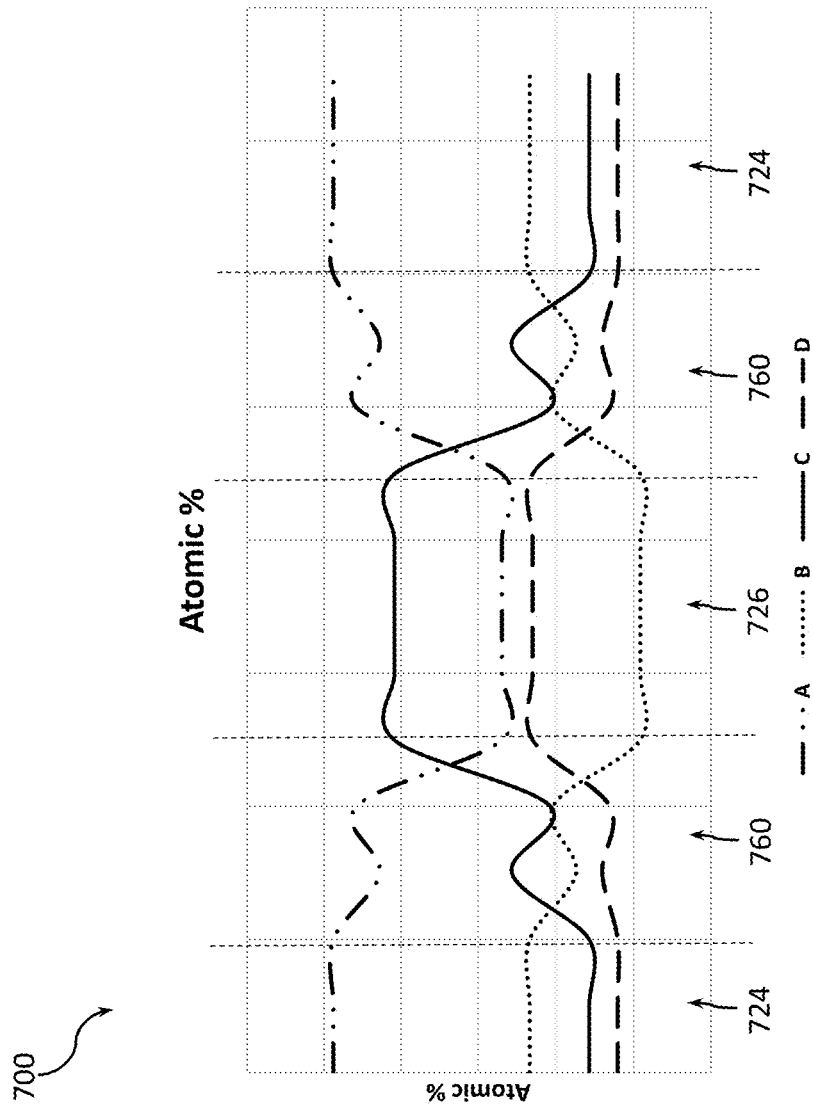
FIG. 7 illustrates differences in atomic composition of a dielectric material in different portions of a cross-section of an opening filled using a combination method described herein in an exemplary case where dissimilar compositions for the dielectric liner and the fill dielectric materials are used, in accordance with some embodiments of the present disclosure.

FIG. 7 provides a schematic illustration 700 of differences in atomic composition of a dielectric material in different portions of a cross-section of an opening filled using a combination method described herein in an exemplary case where dissimilar compositions for the dielectric liner and the fill dielectric materials are used (i.e. the dielectric liner and the fill dielectric are deliberately selected to be different dielectric materials), in accordance with some embodiments of the present disclosure. The illustration of FIG. 7 may be viewed as a cross-section taken along a plane of the thick dashed line shown in FIG. 5B or FIG. 6B (the plane perpendicular to the plane of the drawings of FIG. 5B or FIG. 6B), i.e. the horizontal axis of FIG. 7 indicates distance from one edge of an opening to the other edge of the opening provided on a single line which goes through the center of the opening. The vertical axis of FIG. 7 indicates atomic percentages of various chemical elements of the dielectric materials filling an opening (same applies to the vertical axis of FIG. 8 and that of FIG. 9).

As shown in FIG. 7, the compositional analysis 700 may reveal differences in liner layer regions 724 (one on each side of the cross-section illustrated in FIG. 7), interface layer regions 760 (also one on each side of the cross-section illustrated in FIG. 7), and a center region 726 substantially in the center of the cross-section illustrated in FIG. 7, the regions separated in FIG. 7 with vertical dashed lines. Curves A, B, C, and D illustrated in the compositional analysis 700 are intended to provide exemplary illustrations of atomic percentages of different chemical elements of the dielectric materials filling an opening. For example, curve A could represent an atomic percentage of carbon, curve B could represent an atomic percentage of nitrogen, curve C could represent an atomic percentage of oxygen, and curve D could represent an atomic percentage of hydrogen.

If the compositional analysis 700 is for the scenario illustrated in FIG. 5B, then the liner layer regions 724 shown in FIG. 7 correspond to the liner layer region of the dielectric liner 524, the interface layer regions 760 shown in FIG. 7 correspond to the interface layer region 560, and the center region 726 corresponds to the center region of the fill dielectric 526. The compositional analysis 700 may then reveal that an average atomic percentage of a first chemical element, e.g. chemical element A, within the center region 726 may differ from an average atomic percentage of the same first chemical element within the liner layer region 724 by more than 10%, e.g. by more than 15-17%, preferably by more than 20%. The compositional analysis 700 may also reveal that an average atomic percentage of such a first chemical element within the liner layer region 724 may differ from an average atomic percentage of the same first chemical element within the interface layer region 760 by more than about 5%, e.g. by more than about 7%, preferably by more than about 10% or 15%. Similar deviations may be observed for the atomic percentages of other chemical elements, as can be seen in FIG. 7. Drastically different atomic percentages of the different chemical elements within the liner layer region 724 and the center region 726 would clearly illustrate that the dielectric liner and the fill dielectric materials provided according to a combination method as described herein are intentionally different dielectric materials.

If the compositional analysis 700 is for the scenario illustrated in FIG. 6B, then it may be viewed as a portion of the opening showing only the second portion 674-2 of the dielectric liner and the center region of the fill dielectric 626. In other words, in such a scenario, the liner layer regions 724 shown in FIG. 7 correspond to the second liner layer region 674-2 of the dielectric liner 624, the interface layer regions 760 shown in FIG. 7 correspond to the first interface layer region 660, and the center region 726 corresponds to the center region of the fill dielectric 626. The differences in the compositional analysis between the first and second portions of the dielectric liner are not shown in FIG. 7 but could be analogous to those illustrated in FIG. 9.

Figure 8:
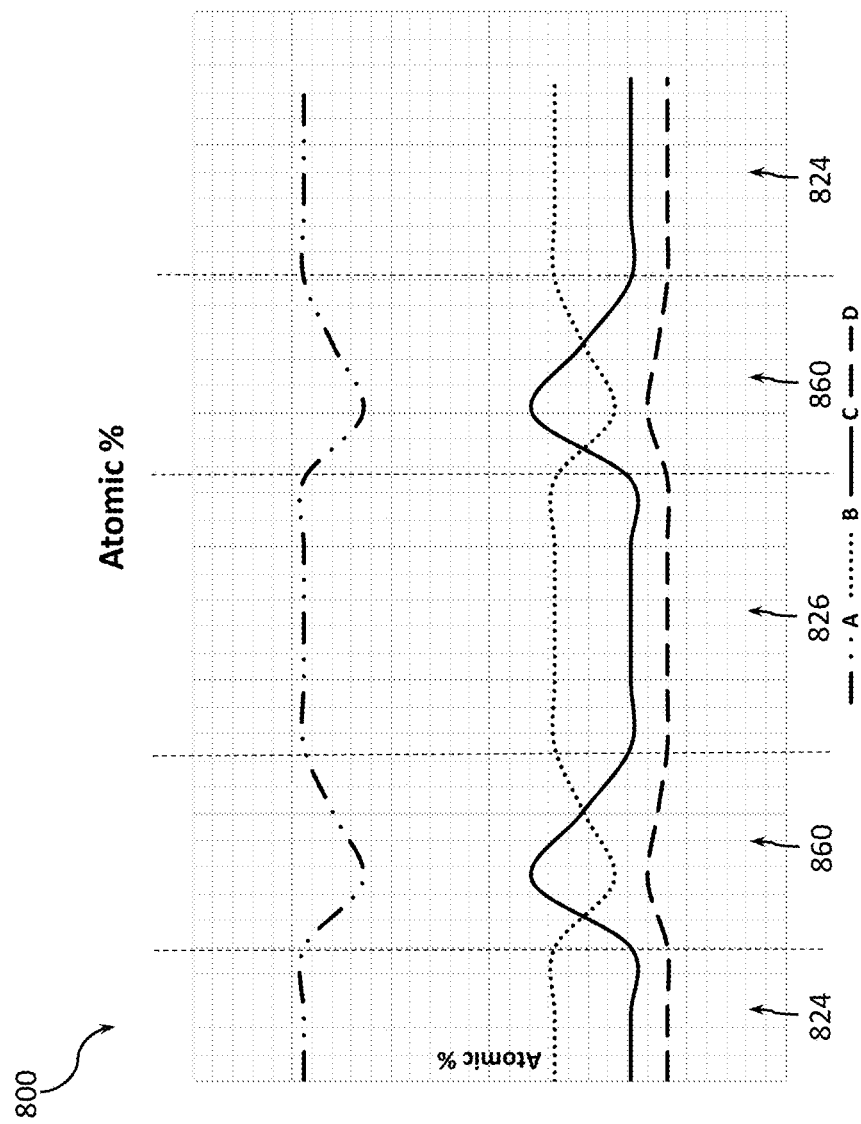
FIG. 8 illustrates differences in atomic composition of a dielectric material in different portions of a cross-section of an opening filled using a combination method described herein in an exemplary case where same or similar compositions for dielectric liner and fill dielectric materials are used and a dielectric liner is deposited in a single cycle, in accordance with some embodiments of the present disclosure.

FIG. 8 provides a schematic illustration of differences in atomic composition of a dielectric material in different portions of a cross-section of an opening filled using a combination method described herein in an exemplary case where same or similar compositions for dielectric liner and fill dielectric materials are used (i.e. the dielectric liner and the fill dielectric are intended to be substantially the same dielectric materials) and a dielectric liner is deposited in a single cycle, in accordance with some embodiments of the present disclosure. The illustration of FIG. 8 may be viewed as a cross-section taken along a plane of the thick dashed line shown in FIG. 5B (the plane perpendicular to the plane of the drawing of FIG. 5B), i.e. the horizontal axis of FIG. 8 indicates distance from one edge of an opening to the other edge of the opening provided on a single line which goes through the center of the opening.

As shown in FIG. 8, the compositional analysis 800 may reveal differences in liner layer regions 824 (one on each side of the cross-section illustrated in FIG. 8), interface layer regions 860 (also one on each side of the cross-section illustrated in FIG. 8), and a center region 826 substantially in the center of the cross-section illustrated in FIG. 8, the regions separated in FIG. 8 with vertical dashed lines. Similar to FIG. 7, curves A, B, C, and D illustrated in the compositional analysis 800 are intended to provide exemplary illustrations of atomic percentages of different chemical elements of the dielectric materials filling an opening.

When the compositional analysis 800 is for the scenario illustrated in FIG. 5B, then the liner layer regions 824 shown in FIG. 8 correspond to the liner layer region of the dielectric liner 524, the interface layer regions 860 shown in FIG. 8 correspond to the interface layer region 560, and the center region 826 corresponds to the center region of the fill dielectric 526. The compositional analysis 800 may then reveal that an average atomic percentage of a first chemical element, e.g. chemical element A, within the center region 726 may differ from an average atomic percentage of the same first chemical element within the liner layer region 724 by less than about 3%, preferably by less than about 2%, which would be consistent with the dielectric liner and the fill dielectric being substantially the same dielectric materials. However, the differences at the interface would still be noticeable. Namely, the compositional analysis 800 may further reveal that an average atomic percentage of such a first chemical element within the liner layer region 824 may differ from an average atomic percentage of the same first chemical element within the interface layer region 860 by more than 5%, e.g. by more than 10%, preferably by more than 15%. Similar deviations may be observed for the atomic percentages of other chemical elements, as can be seen in FIG. 8. Substantially same/similar atomic percentages of the different chemical elements within the liner layer region 824 and the center region 826 would indicate that the dielectric liner and the fill dielectric materials provided according to a combination method as described herein are substantially the same dielectric materials.

FIG. 9 provides a schematic illustration of differences in atomic composition of a dielectric material in different portions of a cross-section of an opening filled using a combination method described herein in an exemplary case where same or similar compositions for dielectric liner and fill dielectric materials are used (i.e. the dielectric liner and the fill dielectric are intended to be substantially the same dielectric materials) and dielectric liner is deposited in multiple cycles, in accordance with some embodiments of the present disclosure. The illustration of FIG. 9 may be viewed as a cross-section taken along a plane of the thick dashed line shown in FIG. 6B (the plane perpendicular to the plane of the drawing of FIG. 6B), i.e. the horizontal axis of FIG. 9 indicates distance from one edge of an opening to the other edge of the opening provided on a single line which goes through the center of the opening.

As shown in FIG. 9, the compositional analysis 900 may reveal differences in first and second liner layer regions 974-1, 974-2 (a pair of each on each side of the cross-section illustrated in FIG. 9), interface layer regions 960 and 962 (also a pair of each on each side of the cross-section illustrated in FIG. 9), and a center region 926 substantially in the center of the cross-section illustrated in FIG. 9, the regions separated in FIG. 9 with vertical dashed lines. Similar to FIGS. 7 and 8, curves A, B, C, and D illustrated in the compositional analysis 900 are intended to provide exemplary illustrations of atomic percentages of different chemical elements of the dielectric materials filling an opening.

When the compositional analysis 900 is for the scenario illustrated in FIG. 6B, then the first liner layer regions 974-1 shown in FIG. 9 correspond to the first liner layer region 674-1 of the dielectric liner 624, the second liner layer regions 974-2 shown in FIG. 9 correspond to the second liner layer region 674-2 of the dielectric liner 624, the first interface layer regions 960 shown in FIG. 9 correspond to the first interface layer region 660, the second interface layer regions 962 shown in FIG. 9 correspond to the second interface layer region 662, and the center region 926 corresponds to the center region of the fill dielectric 626. The compositional analysis 900 may then reveal that an average atomic percentage of a first chemical element, e.g. chemical element A, within the center region 926 may differ from an average atomic percentage of the same first chemical element within the first liner layer region 974-1 or the second liner layer region 974-2 by less than about 3%, preferably by less than about 2%, which would be consistent with both cycles of deposition of the dielectric liner, as well as the fill dielectric being substantially the same dielectric materials. However, the differences at the interface would still be noticeable. Namely, the compositional analysis 900 may further reveal that an average atomic percentage of such a first chemical element within any one or more of the first liner layer region 974-1, the second liner layer region 974-2, and the center region 926 may differ from an average atomic percentage of the same first chemical element within any one or more of the first interface layer region 960 and the second interface layer region 962 by more than 5%, e.g. by more than 10%, preferably by more than 15%. Similar deviations may be observed for the atomic percentages of other chemical elements, as can be seen in FIG. 9. Substantially same/similar atomic percentages of the different chemical elements within the first and second liner layer regions 974-1 and 974-2 and the center region 926 would indicate that the dielectric liner and the fill dielectric materials provided according to a combination method as described herein are substantially the same dielectric materials.

Various considerations regarding selection of precursor combinations which may be used in the flowable process of 306 shown in FIG. 3 will not be described. It is to be understood, however, that these considerations may only applicable to a subset of precursors which could be used in the combination method described herein and that, in other embodiments, other considerations and precursor combinations are also possible and are within the scope of the present disclosure.

According to some embodiments of the present disclosure, new monomer/co-monomer deposition and cure precursor systems with flowable/bottom up fill capability, as described below, may be used in the flowable processes of the combination method described herein in order to more readily tune important dielectric properties. Specifically, the precursor systems described below utilize monomer functionality comprised of carbosilane, aminosilane, vinyl silanes, vinyl disilanes, and amino vinyl silane/disilane and appropriate co-monomer combinations necessary to achieve flowable/gapfill capability, which allows for tuning composition and stress properties of the subsequent films. Deposition techniques to be leveraged may include remote plasma, direct plasma, and photo-CVD processing. A wide array of post deposition curing and annealing techniques can also be applied.

In summary, the proposed precursor systems may produce SiCN film compositions that offer etch selectivity, have gapfill capability, and are mechanically stress neutral. Tunable compositions may directly increase the film to film selectivity options in defining the patterns. Such diverse selectivity is critical to support scaling, specifically enabling more complex and smaller features. The processes described herein produce reactive products that possess fluidity or liquid-like behavior, which under deposition conditions results in a bottom up film growth and gapfill. The specified molecules form films and cure through radical addition mechanism, which is inherently stress neutral and will reduce or eliminate pattern distortion, collapse, or voids/seams.

The following key structure attributes simplify the deposition process and offer greater compositional variation. Monomers that contain the vinyl and amine functionality may increase the reactivity of vinyl silanes/disilanes in radical chain/addition polymerizations. The direct incorporation of the carbon and nitrogen in the form of vinyl/amine may create a pre-assembled SiCN structure, which may be retained in the dielectric film. The incorporation of hydrosilyl functionality, in combination with vinyl groups, may provide access to radical addition growth/cure mechanism. The monomer conversion and resulting film may be inherently low shrinkage due to the growth process, thereby yielding films which are stress neutral. Incorporation of co-monomers may enable architectures which collectively take advantage of both monomer functionalities, as opposed to relying upon the generation of a single ideal monomer.

The proposed formulations may be chemically adaptable to a wide range or process tool types such as CVD, FCVD, photo-CVD and tool deposition/cure mechanisms including free radical and ionic chain, addition and photopolymerization. The formulations can also be made photodefinable or cured with the addition of classical photoinitiator instead of relying upon a radical source from direct or remote plasma. Photosensitivity, without further additives, may also be achieved by incorporation of vinyl disilane functionality. The disilane unit may be susceptible to scission with light to yield silyl radicals, which are capable of initiating chain/addition polymerization. The photoexposure of vinyldisilane may form the highly reactive silene functional group. The silene may provide access to step growth/cure through Michael Type addition reactions with amine, amides, alcohol, and acids.

The material requirements for a gapfill are such as to enable patterning and overall feature delineation. The gapfill may be designed to support and fill of less than about 30 nm pitch, an aspect ratio of 5 or greater, without voids/seams, or sidewall delamination. Additionally, in order to define a pattern, an etch selectivity of greater than about 10:1 between gapfill and adjacent materials may be required. These preclude existing technologies where high density plasma (HDP) is known to produce re-entrant defects, and CVD induces voids and seams. Furnace depositions can exceed 600 degrees Celsius, which preclude use in backend applications where thermal processing is limited to less than about 450 degrees Celsius.

Vapor phase processing may be preferred, where monomers have either appreciable vapor pressure to support vapor delivery or are compatible with liquid delivery infrastructure. This provides the capability to adjust composition in the chamber for distinctly different monomers, where each monomer structure and concentration may be independently controlled. This allows process fine tuning and process flexibility to the process engineer, where not only is the concentration tunable, but a single tool and chamber can generate a range of films simply by plumbing additional monomers to the tool.

Compositional drift may be obviated by using monomers containing the desired functionality; the monomers may be pre-designed to contain either the whole SiCN design or a segment prior to deposition. Traditional ALD/CVD/spin-on processes utilize precursors which do not possess pre-organized architecture. Incorporation of the desired elements may come from starting material, co-reactant or curing agent such as NH3, O2 or ozone. Composition may vary with film thickness due to diffusion/reaction limited process. This may yield features that are less dense or less crosslinked in the interior of the 3-D structure to be filled, which causes reduced selectivity, as observed through subsequent wet/dry etch operations.

The precursor systems proposed herein may enable low temperature processing due to the facile reactivity between SiH and vinyl functional groups. This functional group composition has been demonstrated in the coatings industry with subsequent processing to cure and form networks without release of volatile by-products. The volume that is lost in film formation by volatile byproducts causes film shrinkage, which can lead to voiding and pinholes as well as tensile stress. In a traditional SiN process significant volume shrinkage occurs during cure where SiH and NH react to generate the SiN structure. The SiN network is created with a consequence of releasing NH3 and H2. The benefit of the vinyl functionality is that the carbon is retained post cure due to incorporation as a main chain repeat unit. Process of record carbosilane precursors for dielectrics contain pendent/non-main chain Si—CH3/SiO—CH3 functionality which are lost during cure, which results in film shrinkage and mechanically fragile films.

The SiH/vinyl monomer substitution effects and reaction conditions yield distinct architecture. Specifically, the main chain bond sequence for carbon and silicon alone have three distinct characteristics: 1) alkyl/carbon like with silicon side groups (C—C(Si), 2) carbosilane like with carbon sequence length 2 or greater, or 3) silicon carbide (SiC) like where silicon and carbon are alternating. Free radical initiation affords the traditional chain polymerization repeat unit C—C(Si), and through SiH the carbosilane Si—C—C structure. However, during anionic polymerization the SiH functionality rearranges from C—C(Si) to form Si—C. This rearrangement is undesirable in industrial applications where long main chain alkyl sequence lengths of C—C are desired. Thus, fully substituted vinyl silanes are commercially available over those containing SiH functionality. Embodiments of the present disclosure capitalize on the facile rearrangement by performing deposition/cure in an ionic environment in order to purposefully achieve SiC main chain composition.

Figure 10:
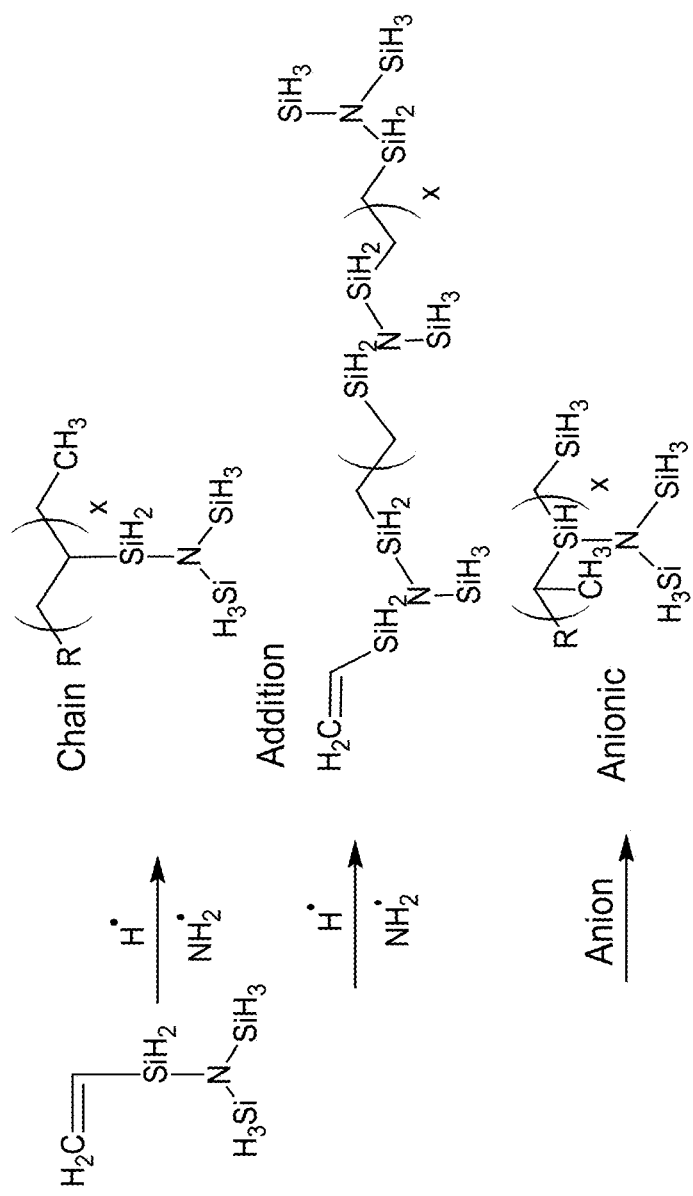
FIG. 10 illustrates an architectural sequence structure for polymer main chain for SiH and vinyl containing monomers, according to some embodiments of the present disclosure.

FIG. 10 illustrates an architectural sequence structure for polymer main chain for SiH and vinyl containing monomers, according to some embodiments of the present disclosure.

Proposed herein are monomer structures that function as traditional polymerizable monomer, but additionally as the photoinitiator package, meaning that fewer or altogether no additional additives are necessary to sustain photopolymerization. Light sensitivity is achieved through disilyl functionalized monomers which undergo photocleavage to create silyl radicals. UV curing applications have demonstrated silyl radicals can be generated from SiH and aminosilanes using conventional thermal/photo initiator packages and are capable of initiating radical polymerization. This provides capability to be photocurable as well as photodefinable, thus pattern features can be generated using traditional lithographic methods. Commercial photodefinable formulations rely upon a photoinitiator package comprised of a photosensitive molecule (aromatic ketone or benzoin structures) and co-initiators (amine, ether, etc.). These can react further in post-processing operations and negatively impact film electrical and mechanical properties, cause shrinkage, increased stress, cracking and delamination.

Monomers of the proposed precursor systems can be blended at the tool/sub-fab using existing on-site blending methodology and deposited by aerosol or vapor phase delivery. Where an oligomer solution (pre-polymer) is desired then this can be achieved using solution style photocurable manufacturing method. This capability can avoid high temperature processing necessary to initiate the polymerization and also avoid use of expensive solvents that are necessary to dissipate the heat generated during polymerization. Current spin-on methods require high temperature pre-oligomerization, use of expensive solvents to compensate for exothermic reaction of the monomers, filtration of the solution to remove high molecular weight particles, and characterization operations all of which are to be performed at a supplier.

The proposal generates SiCN films from monomers containing the following functionality: vinyl silyl amine, blends of monomers, cyclic, vinyl functionality already utilized in polymer coatings, and photoinitiators from UV curing technologies. The monomer can be delivered via CVD vapor or direct liquid injection with push gas of He, Ar, or N2. Deposition of the monomers is achieved through monomer combination with H2 or NH3 remote plasma, direct plasma such as in PECVD processing, or in-situ cure by UV-Photo CVD. The resulting deposited film, is further densified through thermal cure with or without ammonia, and/or photocured with UV radiation.

The radical addition polymerization may be of specific interest because the mechanism, as shown industrially with Thiol-Ene systems, results in a stress neutral film. The radical addition mechanism dissipates stress/strain because molecular motion and re-orientation is able to occur with each successive growth step. A similar result may be achievable with radical chain polymerization where high chain transfer rates occur due to high concentration of abstractable hydrogen atoms. This disclosure specifically makes use of vinyl monomers with hydrosilane/amine functionality, such as vinylsilylamine. It is then possible to achieve a stress neutral film using reactive environments that lead either to radical addition or high chain transfer in a chain polymerization. Otherwise chain polymerization can yield gelation and loss of the liquid phase, mobility at very low conversion, which results in poor gapfill/flow performance.

Free radical chain copolymerization requires careful selection of monomers that are capable of copolymerization. The indiscriminate nature of free radical addition enables a formulation to contain a diverse range of vinyl co-monomers. Specifically, the process has access to both acceptor and donor vinyl character monomers, meaning that a SiCN film generated via radical addition mechanism can be further tuned by incorporating nearly any other vinyl containing monomer. For example thermal and oxidative film stability can be achieved through incorporation of vinyl melamine functionalized monomers, which incidentally also possess a CN repeat unit character. Alternatively, CN functionality is achieved through copolymerization with acrylonitrile, or toughness imparted with use of vinyl norbornene or adamantly analogues.

In a PECVD process chamber the monomers may be exposed to ionic fragments, in addition to the radical addition and chain polymerization. The vinyl hydrosilane functional unit can sustain anionic chain polymerization. The propagating carbanion chain end has facile rearrangement to yield silicon carbide repeat unit. Thus, PECVD process possesses the capability to construct films containing both carbosilane and silicon carbide character, which is related to the radical/ion flux character.

A commercially available stable silene is not available, thus in-situ generation of silene is proposed herein. Stable silenes are very sterically hindered and do not contain functionality that lends to film formation or semiconductor processing requirements. A genuinely unique feature of vinyl disilanes is the ability to generate the highly reactive silene intermediate upon photolysis. The silene is extremely reactive and thereby exceedingly capable of contributing meaningfully to crosslinking and network formation through addition reactions with functional group species such as amines, alcohols, and acids that are present in the film. It is proposed herein to photolyze the film and convert unpolymerized vinyldisilane units into silenes, and drive conversion of unreacted amines into stable SiN functionality.

Figure 11:
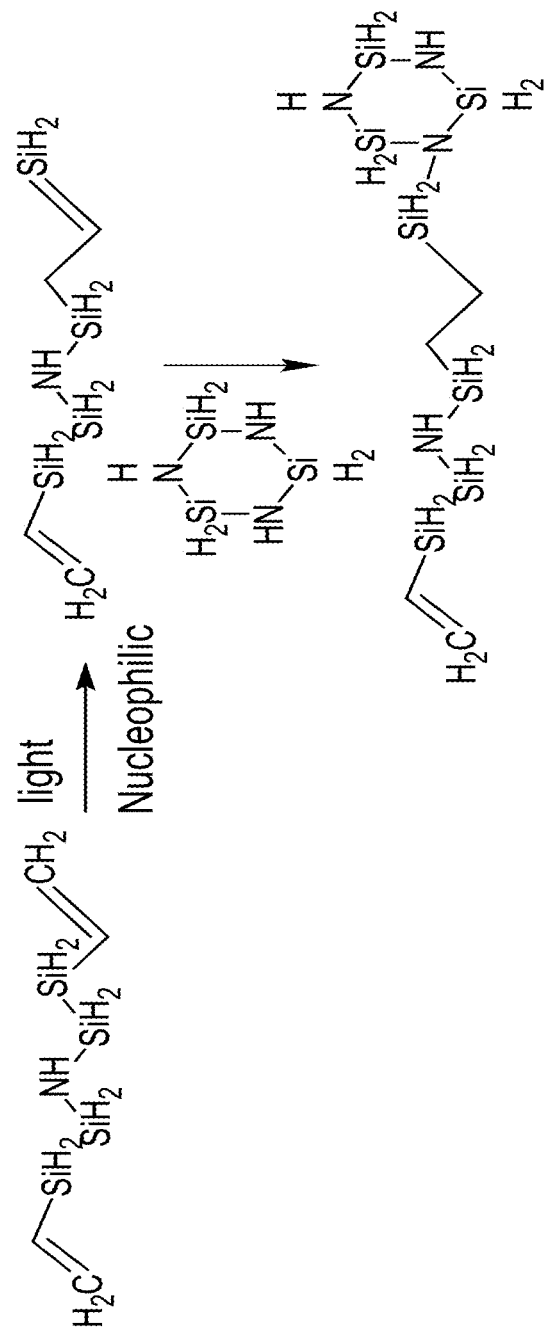
FIG. 11 illustrates vinyl disilane rearrangement to silene, according to some embodiments of the present disclosure.

FIG. 11 illustrates vinyl disilane rearrangement to silene, according to some embodiments of the present disclosure.

The SiH and vinyl functionality necessary to achieve radical addition polymerization can be achieved by delivering a single monomer containing the functional units or from multiple monomers such as trisilylamine and trivinylsilane. A multi-monomer formulation has the practical advantage that the desired film can be achieved without construction of a single idealized monomer structure. The strategy also can provide access to unique monomeric architectures and capitalize upon their respective individual strengths.

The repeat unit can be pre-built through functional monomer design. Cyclic monomers with alternating atomic arrangement of SiC, SiN, and SiCN containing vinyl functionality are proposed. Cyclic monomers that retain ring structure yield improved physical properties over linear analogues. Linear polymers have been demonstrated by anionic ring opening polymerization of cyclic monomers. Thus, in the system proposed herein an aggressive ion flux might destroy ring structure, the resulting film would retain the atomic prearrangement that existed in the cyclic ring.

FIGS. 12A-12H illustrate various precursors for use in providing the fill dielectric in a combination method described herein, in accordance with various embodiments of the present disclosure. In particular, FIGS. 12A-12H illustrate monomer and co-monomer structures, corresponding treatment for each described below, in order to realize the final film.

Figure 12A:
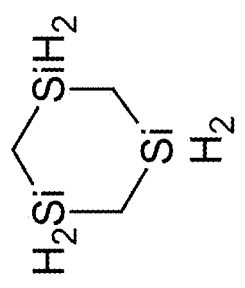

For FIG. 12A, remote/in-situ treatment may include NH3, CH4, O2, O3, ex-situ may include NH3, H2, He, Ar, N2, acetylene, N2O, CO2, CH4, resulting in the final film that includes/is SiCN-nitrogen rich, SiCN-carbon rich, and/or SiONC.

Figure 12B:
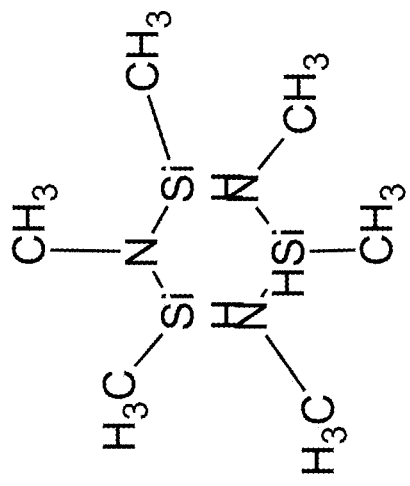

For FIG. 12B, remote/in-situ treatment may include NH3, ex-situ may include NH3, H2, He, Ar, N2, acetylene, N2O, CO2, CH4, resulting in the final film that includes/is SiCN.

Figure 12C:
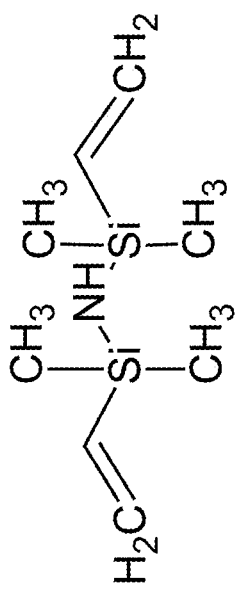

For FIG. 12C, remote/in-situ treatment may include O2, O3, NH3, light, ex-situ may include NH3, H2, He, Ar, N2, acetylene, N2O, CO2, CH4, resulting in the final film that includes/is SiOC-oxygen rich, and/or SiONC.

Figure 12D:
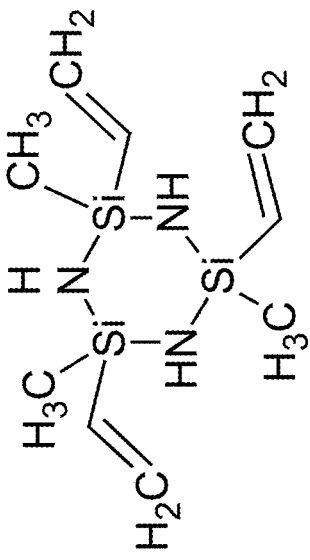

For FIG. 12D, remote/in-situ treatment may include O2, O3, NH3, light, ex-situ may include NH3, H2, He, Ar, N2, acetylene, N2O, CO2, CH4, resulting in the final film that includes/is SiONC and/or SiCN.

Figure 12E:
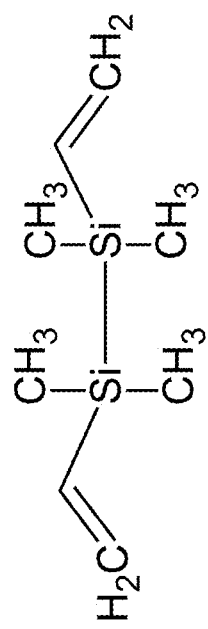

For FIG. 12E, remote/in-situ treatment may include NH3, light, ex-situ may include NH3, H2, He, Ar, N2, acetylene, N2O, CO2, CH4, resulting in the final film that includes/is SiCN-carbon rich.

For FIG. 12F, remote/in-situ treatment may include NH3, CH4, O2, O3, light, ex-situ may include NH3, H2, He, Ar, N2, acetylene, N2O, CO2, CH4, resulting in the final film that includes/is SiCN-nitrogen rich, SiCN-carbon rich, and/or SiONC.

For FIG. 12G, remote/in-situ treatment may include NH3, CH4, O2, O3, light, ex-situ may include NH3, H2, He, Ar, N2, acetylene, N2O, CO2, CH4, resulting in the final film that includes/is SiCN-nitrogen rich, SiCN-carbon rich, and/or SiONC.

For FIG. 12H, remote/in-situ treatment may include NH3, CH4, O2, O3, light, ex-situ may include NH3, H2, He, Ar, N2, acetylene, N2O, CO2, CH4, resulting in the final film that includes/is SiCN-nitrogen rich, SiCN-carbon rich, and/or SiONC.

In other embodiments, RSiO/RSiN molecule can also be used (not shown in FIGS. 12A-12H), for which remote/in-situ treatment may include Zr(N(Me)2)4, Ti(isopropoxide)4, TiCl4, ex-situ may include NH3, H2, He, Ar, N2, resulting in the final film that includes/is metal (M) doped and/or SiNM.

During monomer synthesis byproducts may be generated in addition to the desired target structure. Traditional manufacturing practices would attempt to purify and increase the assay of the target monomer. The consequence of this practice is that byproducts may be viable and useful monomers in their own right and are otherwise discarded. Embodiments of the present disclosure recognize that the target product and byproducts are a blend of structurally distinct monomers and could be used together in a gapfill process and that it would be desirable to retain access to the monomer mixture for its own merit, in addition to making use of the blended product where purification may pose separate issues such as low yield or where the target monomer is cost prohibitive.

The capability and willingness to utilize a monomer blend provides access to otherwise difficult to source monomer structures. For example, a blend of silyl amines are produced during synthesis. Instead of purifying the mixture, subsequent vinyl functionalization of the silyl amine blend can proceed, which yields vinyl monomers with a range of size and functionality. Purification steps can be taken to improve the safety and quality of the blend through distillation to separate volatiles and heavies. It is proposed to accept this blend consisting of not only an ideal structure, but also isomers and structural analogues with a range functionalization after appropriate purification as necessary to be compliant with semiconductor quality and safety expectations. The resulting blend can be delivered using a liquid vaporizer.

Figure 13:
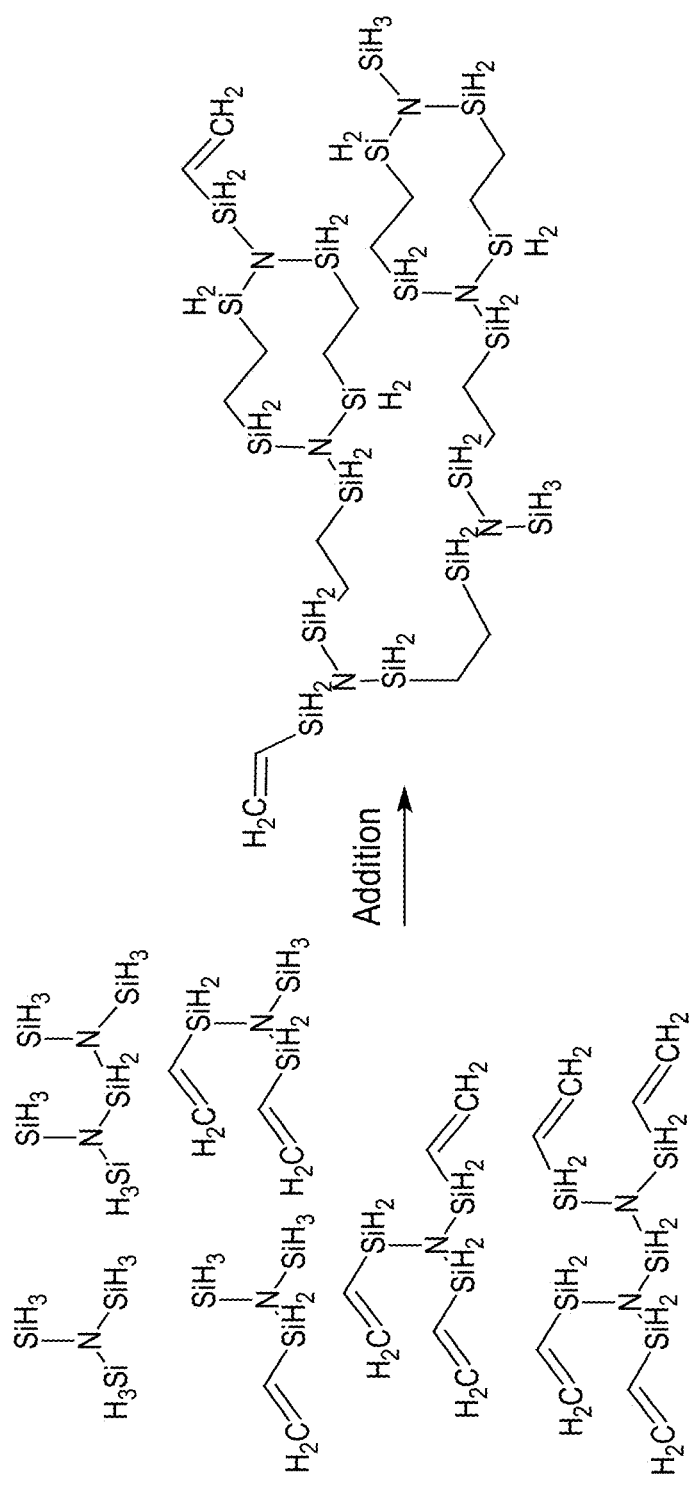
FIG. 13 illustrates radical addition of a monomer blend and resulting microstructure, according to some embodiments of the present disclosure.

FIG. 13 illustrates radical addition of a monomer blend and resulting microstructure, according to some embodiments of the present disclosure.

Compositional variation is further envisioned with incorporation of metals, metalloids, or other inorganic character. Incorporation of metal precursors during deposition or post modification of the film with metal oxides or metal nitrides offers further compositional variation. Flowable character as well as electrical and dielectric properties can be adjusted through exposure to borates or phosphates which yields boron/phosphorous incorporation. Likewise oxidative stability or network flexibility is afforded through incorporation of oxygen or sulfur.

Analytical metrology techniques can provide insight into the class of precursor/monomer used to create the gapfill structure where the film contains remaining ligands or unreacted functionality. Nano Fourier-Transform infrared spectroscopy metrology possessing a 20 nm spot size may serve as a viable analytical tool characterize chemical structure and functionality. Unreacted vinyl functionality can be evaluated which possesses a absorbance peak occurring near 900 and 3000 wavenumber. Likewise, absorption of aromatic (benzene/phenyl) functionality (3070 wavenumber) from a photoinitiator package and applicable photo-disassociation products such as benzaldehyde (aldehyde at 1720 wavenumber) can be observed. Additionally, cyano or triazene functionality from nitrile or melamine based monomers is distinguished from fully saturated analogues. Although, due to the aromaticity of melamine it provides chemical stability, and oxidative inertness and mechanical strength which may distinguishable even in fully cured films.

Likewise, the incomplete conversion of NH into carbonitride or silicon nitride morphological structure can be followed using FTIR for the difference in nitrogen with bonding toward hydrogen vs with carbon or silicon.

Vinyl functionality can also be inferred from traditional organic wet chemistry unknown identification techniques, namely exposure of a TEM image to HBr gas, which reacts readily with the vinyl functionality to generate CBrCH structure. Again, FTIR techniques can observe the disappearance of the vinyl absorbance band and the formation of the alkyl brominated band.

The analytical inspection of an unreacted precursor/monomer containing SiH or SiSi lead to SiOH or SiOOH intermediates upon contamination with water and oxygen are observable at trace concentrations. This widely known precursor inspection technique can be leveraged to assess ligand functionality present in a semiconductor gapfill. Methods to observer SiH and SiSi functionality which remain in the film due to incomplete reaction would likely be observed as SiO through metrology techniques due to the rapid and facile reaction of SiH and SiSi with ambient water and oxygen. However, preparation techniques may exist to enable metrology sampling on a time scale where the original functionality can be observed and also through reaction with water or oxygen would generate the appearance of a SiO absorption peak. Ideally, the experiment is controlled where the short lived, SiOH (silanol) and or SiOOH (hydroperoxide) intermediate is observable prior to condensation into SiOSi.

Structures having openings filled with a dielectric material using a combination method as disclosed herein may be included in any suitable electronic device. FIGS. 14-17 illustrate various examples of apparatuses that may include such structures.

Figures 14A, 14B:
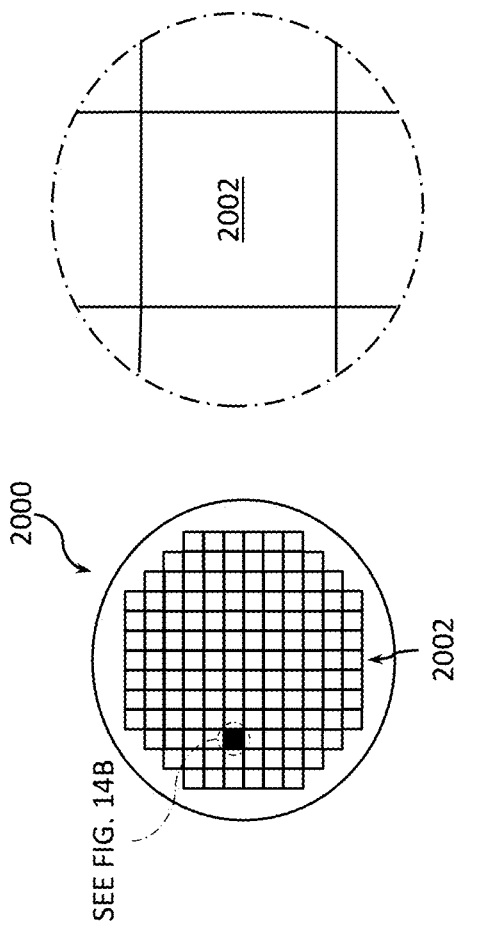
FIGS. 14A and 14B are top views of a wafer and dies that include one or more structures which have openings filled with a dielectric material using a combination method in accordance with any of the embodiments disclosed herein.

FIGS. 14A-B are top views of a wafer 2000 and dies 2002 that may include one or more structures which have openings filled with a dielectric material using a combination method in accordance with any of the embodiments disclosed herein. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more components having structures with openings filled with a dielectric material using a combination method as described herein). After the fabrication of the semiconductor product is complete (e.g., after manufacture of one or more components having structures with openings with provided dielectric materials as described herein), the wafer 2000 may undergo a singulation process in which each of the dies 2002 is separated from one another to provide discrete "chips" of the semiconductor product. In particular, devices that include one or more components having structures with openings filled with a dielectric material using a combination method as disclosed herein may take the form of the wafer 2000 (e.g., not singulated) or the form of the die 2002 (e.g., singulated). The die 2002 may include one or more transistors (e.g., one or more of the transistors 2140 of FIG. 15, discussed below, and/or supporting circuitry to route electrical signals to the transistors, as well as any other IC components, each of which may include structures with openings with provided dielectric materials as described herein. In some embodiments, the wafer 2000 or the die 2002 may include a memory device (e.g., a static random access memory (SRAM) device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2302 of FIG. 17) or other logic that is configured to store information in the memory devices or execute instructions stored in the memory array.

Figure 15:
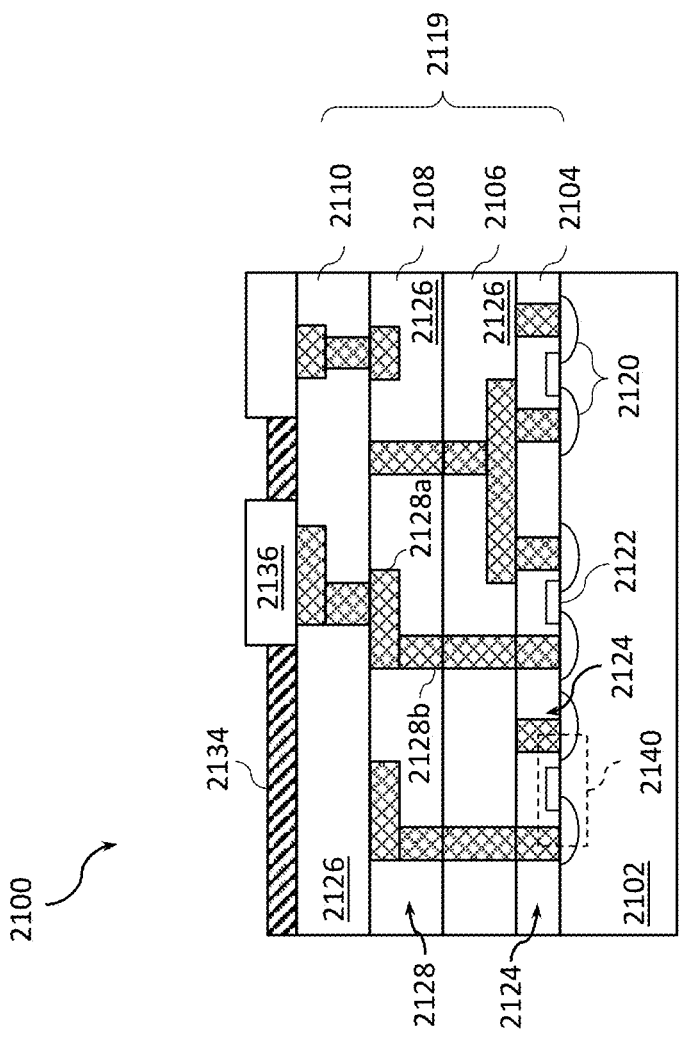
FIG. 15 is a cross-sectional side view of an IC device that may include one or more structures which have openings filled with a dielectric material using a combination method in accordance with any of the embodiments disclosed herein.

FIG. 15 is a cross-sectional side view of an IC device 2100 that may include one or more structures which have openings filled with a dielectric material using a combination method in accordance with any of the embodiments disclosed herein. The IC device 2100 may be formed on a substrate 2102 (e.g., the wafer 2000 of FIG. 14A) and may be included in a die (e.g., the die 2002 of FIG. 14B). The substrate 2102 may be a semiconductor substrate as described above with reference to FIG. 3. Although a few examples of materials from which the substrate 2102 may be formed are described here, any material that may serve as a foundation for an IC device 2100 may be used. The substrate 2102 may be part of a singulated die (e.g., the dies 2002 of FIG. 14B) or a wafer (e.g., the wafer 2000 of FIG. 14A).

The IC device 2100 may include one or more device layers 2104 disposed on the substrate 2102. The device layer 2104 may include features of one or more transistors 2140 (e.g., MOSFETs) formed on the substrate 2102. The device layer 2104 may include, for example, one or more source and/or drain (S/D) regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like. The transistors 2140 are not limited to the type and configuration depicted in FIG. 15 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors. In particular, at least some of the one or more of the transistors 2140 may include structures which have openings with provided dielectric materials disclosed herein.

One or more interlayer dielectrics (ILDs) may be deposited over the MOS transistors. In general, an ILD or inter metal dielectric (IMD) refers to an insulating material used between metal conductors and devices (such as transistors) in integrated circuit devices. ILD layers may be formed using dielectric materials known for their applicability in integrated circuit structures, such as dielectric materials. Examples of dielectric materials that may be used include, but are not limited to, silicon dioxide, carbon-doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

The S/D regions 2120 may be formed within the substrate 2102 adjacent to the gate 2122 of each transistor 2140. The S/D regions 2120 are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

Each transistor 2140 may include a gate 2122 formed of at least two layers, a gate dielectric layer and a gate electrode layer, as described above. Generally, the gate dielectric layer of a transistor 2140 may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may include at least one P-type workfunction metal or N-type workfunction metal, depending on whether the transistor is to be a PMOS or an NMOS transistor. In some implementations, the gate electrode layer may include a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some embodiments, when viewed as a cross section of the transistor 2140 along the source-channel-drain direction, the gate electrode may include a U-shaped structure that includes a bottom portion substantially parallel to the surface of the substrate and two sidewall portions that are substantially perpendicular to the top surface of the substrate (e.g., in a FinFET). In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

Electrical signals, such as power and/or input/output (I/O) signals, may be routed to and/or from the transistors 2140 of the device layer 2104 through one or more interconnect layers disposed on the device layer 2104 (illustrated in FIG. 15 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an ILD stack 2119 of the IC device 2100. Although not specifically shown in FIG. 15, each of the one or more interconnect layers 2106-2110 may advantageously include one or more structures which have openings with provided dielectric materials in accordance with any of the embodiments disclosed herein.

The interconnect structures 2128 may be arranged within the interconnect layers 2106-2110 to route electrical signals according to a wide variety of designs (in particular, the arrangement is not limited to the particular configuration of interconnect structures 2128 depicted in FIG. 15). Although a particular number of interconnect layers 2106-2210 is depicted in FIG. 15, embodiments of the present disclosure include IC devices having more or fewer interconnect layers than depicted.

In some embodiments, the interconnect structures 2128 may include trench structures 2128a (sometimes referred to as "lines") and/or via structures 2128b (sometimes referred to as "holes") filled with an electrically conductive material such as a metal. The trench structures 2128a may be arranged to route electrical signals in a direction of a plane that is substantially parallel with a surface of the substrate 2102 upon which the device layer 2104 is formed. For example, the trench structures 2128a may route electrical signals in a direction in and out of the page from the perspective of FIG. 15. The via structures 2128b may be arranged to route electrical signals in a direction of a plane that is substantially perpendicular to the surface of the substrate 2102 upon which the device layer 2104 is formed. In some embodiments, the via structures 2128b may electrically couple trench structures 2128a of different interconnect layers 2106-2110 together.

The interconnect layers 2106-2110 may include a dielectric material 2126 disposed between the interconnect structures 2128, as shown in FIG. 15. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same.

A first interconnect layer 2106 (referred to as Metal 1 or "M1") may be formed directly on the device layer 2104. In some embodiments, the first interconnect layer 2106 may include trench structures 2128a and/or via structures 2128b, as shown. The trench structures 2128a of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128b to couple the trench structures 2128a of the second interconnect layer 2108 with the trench structures 2128a of the first interconnect layer 2106. Although the trench structures 2128a and the via structures 2128b are structurally delineated with a line within each interconnect layer (e.g., within the second interconnect layer 2108) for the sake of clarity, the trench structures 2128a and the via structures 2128b may be structurally and/or materially contiguous (e.g., simultaneously filled during a dual-damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The IC device 2100 may include a solder resist material 2134 (e.g., polyimide or similar material) and one or more bond pads 2136 formed on the interconnect layers 2106-2110. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106-2110 than depicted in other embodiments. For example, the bond pads 2136 may be replaced by or may further include other analogous features (e.g., posts) that route the electrical signals to external components.

Figure 16:
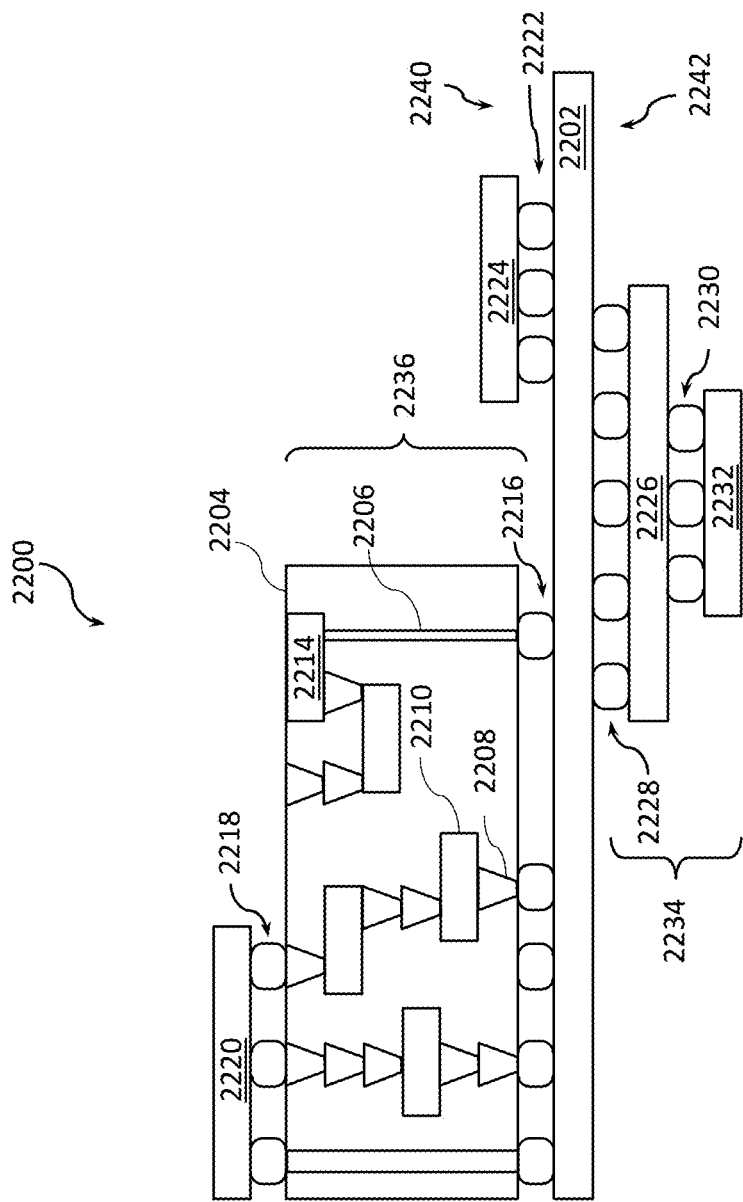
FIG. 16 is a cross-sectional side view of an IC device assembly that may include one or more structures which have openings filled with a dielectric material using a combination method in accordance with any of the embodiments disclosed herein.

FIG. 16 is a cross-sectional side view of an IC device assembly 2200 that may include one or more structures which openings filled with a dielectric material using a combination method in accordance with any of the embodiments disclosed herein. The IC device assembly 2200 includes a number of components disposed on a circuit board 2202 (which may be, e.g., a motherboard). The IC device assembly 2200 includes components disposed on a first face 2240 of the circuit board 2202 and an opposing second face 2242 of the circuit board 2202; generally, components may be disposed on one or both faces 2240 and 2242. In particular, any suitable ones of the components of the IC device assembly 2200 may include any of the structures having openings filled with a dielectric material using a combination method in accordance with any of the embodiments disclosed herein.

In some embodiments, the circuit board 2202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2202. In other embodiments, the circuit board 2202 may be a non-PCB substrate.

The IC device assembly 2200 illustrated in FIG. 16 includes a package-on-interposer structure 2236 coupled to the first face 2240 of the circuit board 2202 by coupling components 2216. The coupling components 2216 may electrically and mechanically couple the package-on-interposer structure 2236 to the circuit board 2202, and may include solder balls (as shown in FIG. 16), male and female portions of a socket, an adhesive, an underfill material, and/or any other suitable electrical and/or mechanical coupling structure.

The package-on-interposer structure 2236 may include an IC package 2220 coupled to an interposer 2204 by coupling components 2218. The coupling components 2218 may take any suitable form for the application, such as the forms discussed above with reference to the coupling components 2216. Although a single IC package 2220 is shown in FIG. 16, multiple IC packages may be coupled to the interposer 2204; indeed, additional interposers may be coupled to the interposer 2204. The interposer 2204 may provide an intervening substrate used to bridge the circuit board 2202 and the IC package 2220. The IC package 2220 may be or include, for example, a die (the die 2002 of FIG. 14B), an IC device (e.g., the IC device 2100 of FIG. 15), or any other suitable component. Generally, the interposer 2204 may spread a connection to a wider pitch or reroute a connection to a different connection. For example, the interposer 2204 may couple the IC package 2220 (e.g., a die) to a ball grid array (BGA) of the coupling components 2216 for coupling to the circuit board 2202. In the embodiment illustrated in FIG. 16, the IC package 2220 and the circuit board 2202 are attached to opposing sides of the interposer 2204; in other embodiments, the IC package 2220 and the circuit board 2202 may be attached to a same side of the interposer 2204. In some embodiments, three or more components may be interconnected by way of the interposer 2204.

The interposer 2204 may be formed of an epoxy resin, a fiberglass-reinforced epoxy resin, a ceramic material, or a polymer material such as polyimide. In some implementations, the interposer 2204 may be formed of alternate rigid or flexible materials that may include the same materials described above for use in a semiconductor substrate, such as silicon, germanium, and other group III-V and group IV materials. The interposer 2204 may include metal interconnects 2208 and vias 2210, including but not limited to through-silicon vias (TSVs) 2206. The interposer 2204 may further include embedded devices 2214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 2204. The package-on-interposer structure 2236 may take the form of any of the package-on-interposer structures known in the art.

The IC device assembly 2200 may include an IC package 2224 coupled to the first face 2240 of the circuit board 2202 by coupling components 2222. The coupling components 2222 may take the form of any of the embodiments discussed above with reference to the coupling components 2216, and the IC package 2224 may take the form of any of the embodiments discussed above with reference to the IC package 2220.

The IC device assembly 2200 illustrated in FIG. 16 includes a package-on-package structure 2234 coupled to the second face 2242 of the circuit board 2202 by coupling components 2228. The package-on-package structure 2234 may include an IC package 2226 and an IC package 2232 coupled together by coupling components 2230 such that the IC package 2226 is disposed between the circuit board 2202 and the IC package 2232. The coupling components 2228 and 2230 may take the form of any of the embodiments of the coupling components 2216 discussed above, and the IC packages 2226 and 2232 may take the form of any of the embodiments of the IC package 2220 discussed above. The package-on-package structure 2234 may be configured in accordance with any of the package-on-package structures known in the art.

Figure 17:
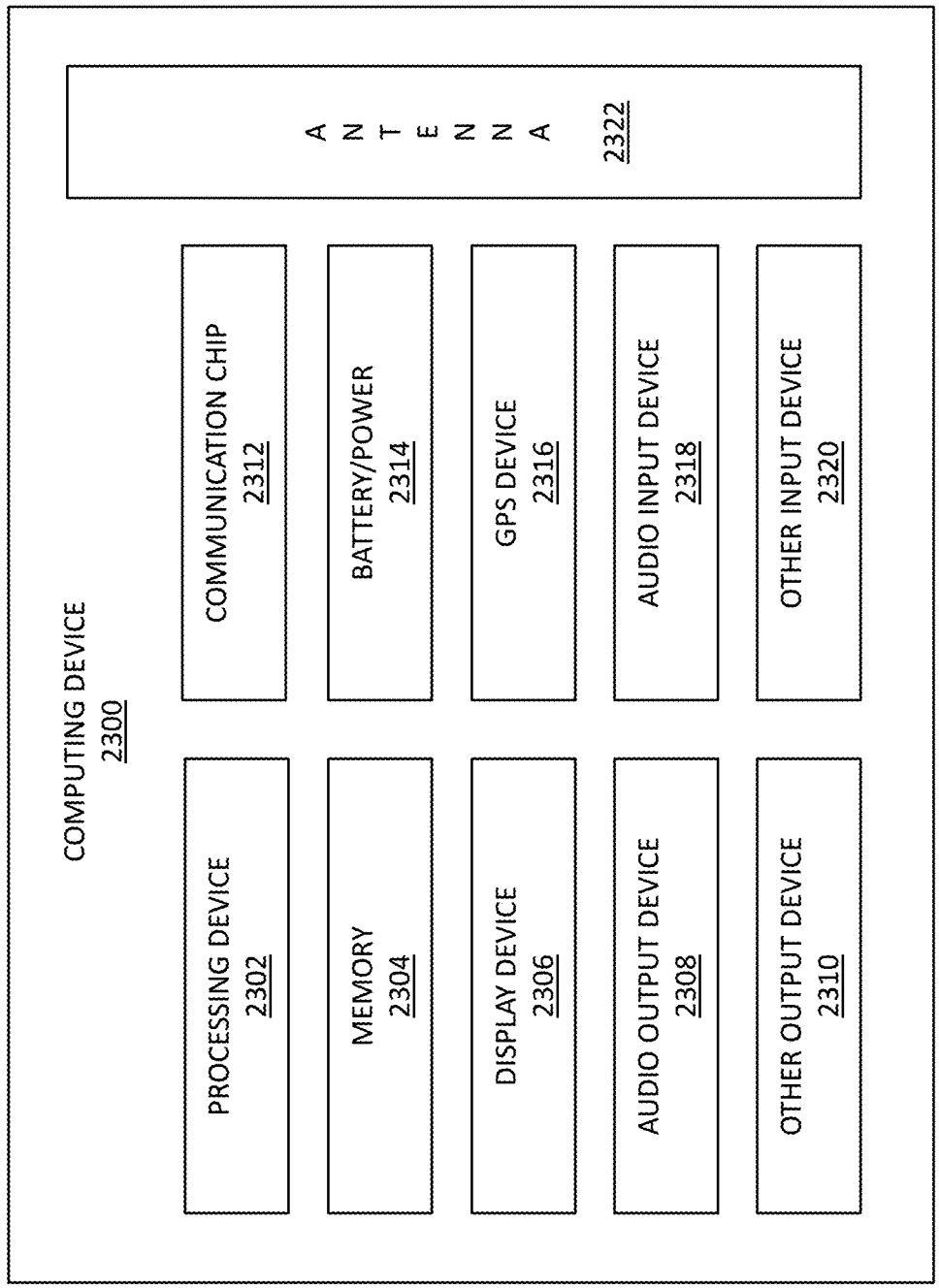
FIG. 17 is a block diagram of an example computing device that may include one or more structures which have openings filled with a dielectric material using a combination method in accordance with any of the embodiments disclosed herein.

FIG. 17 is a block diagram of an example computing device 2300 that may include one or more components including one or more structures having openings filled with a dielectric material using a combination method in accordance with any of the embodiments disclosed herein. For example, any suitable ones of the components of the computing device 2300 may include a die (e.g., the die 2002 (FIG. 14B)) having one or more interconnects or other IC chip components incorporating structures having openings filled with a dielectric material using a combination method in accordance with any of the embodiments disclosed herein. Any one or more of the components of the computing device 2300 may include, or be included in, an IC device 2100 (FIG. 15). Any one or more of the components of the computing device 2300 may include, or be included in, an IC device assembly 2200 (FIG. 16).

A number of components are illustrated in FIG. 17 as included in the computing device 2300, but any one or more of these components may be omitted or duplicated, as suitable for the application. In some embodiments, some or all of the components included in the computing device 2300 may be attached to one or more motherboards. In some embodiments, some or all of these components are fabricated onto a single system-on-a-chip (SoC) die.

Additionally, in various embodiments, the computing device 2300 may not include one or more of the components illustrated in FIG. 17, but the computing device 2300 may include interface circuitry for coupling to the one or more components. For example, the computing device 2300 may not include a display device 2306, but may include display device interface circuitry (e.g., a connector and driver circuitry) to which a display device 2306 may be coupled. In another set of examples, the computing device 2300 may not include an audio input device 2318 or an audio output device 2308, but may include audio input or output device interface circuitry (e.g., connectors and supporting circuitry) to which an audio input device 2318 or audio output device 2308 may be coupled.

The computing device 2300 may include a processing device 2302 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2302 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2300 may include a memory 2304, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2304 may include memory that shares a die with the processing device 2302. This memory may be used as cache memory and may include embedded dynamic random access memory (eDRAM) or spin transfer torque magnetic random access memory (STT-MRAM).

In some embodiments, the computing device 2300 may include a communication chip 2312 (e.g., one or more communication chips). For example, the communication chip 2312 may be configured for managing wireless communications for the transfer of data to and from the computing device 2300. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2312 may operate in accordance with other wireless protocols in other embodiments. The computing device 2300 may include an antenna 2322 to facilitate wireless communications and/or to receive other wireless communications (such as AM or FM radio transmissions).

In some embodiments, the communication chip 2312 may manage wired communications, such as electrical, optical, or any other suitable communication protocols (e.g., the Ethernet). As noted above, the communication chip 2312 may include multiple communication chips. For instance, a first communication chip 2312 may be dedicated to shorter-range wireless communications such as Wi-Fi or Bluetooth, and a second communication chip 2312 may be dedicated to longer-range wireless communications such as global positioning system (GPS), EDGE, GPRS, CDMA, WiMAX, LTE, EV-DO, or others. In some embodiments, a first communication chip 2312 may be dedicated to wireless communications, and a second communication chip 2312 may be dedicated to wired communications.

The computing device 2300 may include battery/power circuitry 2314. The battery/power circuitry 2314 may include one or more energy storage devices (e.g., batteries or capacitors) and/or circuitry for coupling components of the computing device 2300 to an energy source separate from the computing device 2300 (e.g., AC line power).

The computing device 2300 may include a GPS device 2316 (or corresponding interface circuitry, as discussed above). The GPS device 2316 may be in communication with a satellite-based system and may receive a location of the computing device 2300, as known in the art.

The computing device 2300 may include a display device 2306 (or corresponding interface circuitry, as discussed above). The display device 2306 may include any visual indicators, such as a heads-up display, a computer monitor, a projector, a touchscreen display, a liquid crystal display (LCD), a light-emitting diode display, or a flat panel display, for example.

The computing device 2300 may include an audio output device 2308 (or corresponding interface circuitry, as discussed above). The audio output device 2308 may include any device that generates an audible indicator, such as speakers, headsets, or earbuds, for example.

The computing device 2300 may include an audio input device 2318 (or corresponding interface circuitry, as discussed above). The audio input device 2318 may include any device that generates a signal representative of a sound, such as microphones, microphone arrays, or digital instruments (e.g., instruments having a musical instrument digital interface (MIDI) output).

The computing device 2300 may include an other output device 2310 (or corresponding interface circuitry, as discussed above). Examples of the other output device 2310 may include an audio codec, a video codec, a printer, a wired or wireless transmitter for providing information to other devices, or an additional storage device.

The computing device 2300 may include an other input device 2320 (or corresponding interface circuitry, as discussed above). Examples of the other input device 2320 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2300 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2300 may be any other electronic device that processes data.

The following paragraphs provide various examples of the embodiments disclosed herein.

Example 1 provides a method for manufacturing a structure with a plurality of openings filled with a dielectric material. The method includes depositing a solid layer of a first dielectric material (referred to in the following Examples as a "dielectric liner") on inner surfaces of the plurality of openings, and, following the deposition of the first dielectric material, filling remaining empty volume of the plurality of openings with a flowable second dielectric material (referred to in the following Examples as a "fill dielectric"). The method also includes cross-linking bonds of the second dielectric material to solidify the second dielectric material, e.g. by applying an excitation/stimuli to facilitate cross-linking of the compounds (typically oligomers) of the flowable second dielectric material into a solid matrix of the second dielectric material within the plurality of openings lined with the first dielectric material.

Example 2 provides the method according to Example 1, where each of the plurality of openings has an aspect ratio between about 1 and 170, including all values and ranges therein, preferably greater than about 6, where an aspect ratio is a ratio of a depth of an opening to a width of the opening.

Example 3 provides the method according to any one of the preceding Examples, where the dielectric liner occupies between about 1 and 95% of a volume of each of the plurality of openings, including all values and ranges therein.

Example 4 provides the method according to any one of the preceding Examples, where depositing the dielectric liner includes performing a non-flowable growth process such as e.g. one or more of ALD, PE-ALD, CVD, and PE-CVD.

Example 5 provides the method according to any one of the preceding Examples, where filling the remaining volume of the plurality of openings with the flowable fill dielectric includes performing a flowable fill process such as e.g. one or more of FCVD, PE-FCVD, spin-coating, and dip-coating.

Example 6 provides the method according to any one of the preceding Examples, where filling the remaining volume of the plurality of openings with the flowable fill dielectric includes heating up one or more precursors for the flowable fill dielectric to a temperature above a glass transition temperature of said one or more precursors, e.g. heating said one or more precursors to 125 degrees Celsius for 5 minutes.

Example 7 provides the method according to any one of the preceding Examples, where cross-linking bonds of the second dielectric material by applying the excitation includes baking the structure at a temperature above about 200 degrees Celsius, e.g. above about 300 degrees Celsius or above about 350 degrees Celsius, which baking may be carried out for e.g. about 5 to 60 minutes.

Example 8 provides the method according to any one of the preceding Examples, where cross-linking bonds of the second dielectric material by applying the excitation includes applying an optical excitation.

Example 9 provides the method according to any one of the preceding Examples, further including performing an outgassing of the solid fill dielectric.

Example 10 provides the method according to Example 9, where the outgassing includes baking the structure at about 400 to 450 degrees Celsius for about 1 to 30 minutes.

Example 11 provides the method according to any one of the preceding Examples, further including curing the solid fill dielectric.

Example 12 provides the method according to Example 11, where the curing includes heating the structure to temperatures between about 200-450 degrees Celsius while simultaneously exposing the solid fill dielectric to optical radiation of e.g. 170-254 nanometer wavelengths.

Example 13 provides the method according to Example 11, where the curing includes heating the structure to temperatures between about 200-450 degrees Celsius while simultaneously exposing the solid fill dielectric to charged particles (e.g. electrons).

Example 14 provides the method according to any one of Examples 1-13, where the dielectric liner and the solid fill dielectric are substantially same dielectric materials.

Example 15 provides the method according to any one of Examples 1-13, where the dielectric liner and the solid fill dielectric are different dielectric materials.

Example 16 provides an assembly that includes a structure including at least one opening. The opening includes a first dielectric material on side walls of the opening (i.e. a liner layer region including a dielectric material extending from, e.g. starting from, side walls towards a center of the opening by a first distance), a second dielectric material at least partially enclosed (i.e. encompassed or surrounded) by the first dielectric material, and an interface region between the first dielectric material and the second dielectric material. Thus, the interface region is an interface layer region including a dielectric material at least partially encompassed by the first dielectric material of the liner layer region, and the second dielectric material is provided in what can be viewed as a center region that is at least partially encompassed by the dielectric material of the interface layer region. In such an assembly, an average atomic percentage of a first chemical element within the liner layer region may differ from an average atomic percentage of the first chemical element within the interface layer region by more than about 5%, e.g. by more than about 7%, preferably by more than about 10% or 15%.

Example 17 provides the assembly according to Example 16, where an average atomic percentage of the first chemical element within the center region differs from the average atomic percentage of the first chemical element within the liner layer region by less than about 3%, preferably by less than about 2%.

Example 18 provides the assembly according to Example 17, where an average atomic percentage of a second chemical element within the liner layer region differs from an average atomic percentage of the second chemical element within the interface layer region by more than about 5%, e.g. by more than about 7%, preferably by more than about 10% or 15%, and an average atomic percentage of the second chemical element within the center region differs from the average atomic percentage of the second chemical element within the liner layer region by less than about 3%, preferably by less than about 2%.

Example 19 provides the assembly according to Examples 17 or 18, where the interface layer region extends from (i.e. starts from) the liner layer region towards the center of the opening by a second distance.

Example 20 provides the assembly according to Examples 17 or 18, where the liner layer region is a first liner layer region and the interface layer region is a first interface layer region extending from (i.e. starting from) the first liner layer region towards the center of the opening by a second distance, and the opening further includes a second liner layer region including a dielectric material extending from (i.e. starting from) the first interface layer region towards a center of the opening by a third distance, a second interface layer region including a dielectric material at least partially encompassed by the dielectric material of the second liner layer region, and the dielectric material of the center region is at least partially encompassed by the dielectric material of the second interface layer region.

Example 21 provides the assembly according to Example 20, where an average atomic percentage of the first chemical element within the second liner layer region differs from an average atomic percentage of the first chemical element within the second interface layer region or the average atomic percentage of the first chemical element within the first interface layer region by more than about 5%, e.g. by more than about 7%, preferably by more than about 10% or 15%.

Example 22 provides the assembly according to Examples 20 or 21, where an average atomic percentage of the first chemical element within the second liner region differs from an average atomic percentage of the first chemical element within the center region or the average atomic percentage of the first chemical element within the first liner layer region by less than about 3%, preferably by less than about 2%.

Example 23 provides the assembly according to any one of Examples 20-22, where the average atomic percentage of the first chemical element within the second interface region differs from the average atomic percentage of the first chemical element within the first liner region or an average atomic percentage of the first chemical element within the center region by more than about 5%, e.g. by more than about 7%, preferably by more than about 10% or 15%.

Example 24 provides the assembly according to Example 16, where an average atomic percentage of the first chemical element within the center region differs from the average atomic percentage of the first chemical element within the liner layer region by more than 15%, e.g. by more than 17%, preferably by more than 20%.

Example 25 provides the assembly according to any one of Examples 16-24, where the liner layer region occupies between about 2 and 90% of a volume of the opening.

Example 26 provides the assembly according to any one of Examples 16-25, where the opening has an aspect ratio between about 1 and 170, including all values and ranges therein, preferably greater than about 6, where an aspect ratio is a ratio of a depth of the opening to a width of the opening.

Example 27 provides the assembly according to any one of Examples 16-26, where the plurality of openings have depths of 5 to 170 nanometers.

Example 28 provides the assembly according to any one of Examples 16-27, further including a capping material over the opening.

Example 29 provides the assembly according to Example 28, where the capping material over the opening and the dielectric materials within the opening have different etch properties.

Example 30 provides an assembly that includes a structure including at least one opening, the opening including a layer of a first dielectric material (i.e. the dielectric liner) provided on side walls and a floor of the opening, and a second dielectric material (i.e. the fill dielectric) in a remaining volume of the opening, where the first dielectric material is different from the second dielectric material.

Example 31 provides the assembly according to Example 30, where the opening has an aspect ratio between about 1 and 170, including all values and ranges therein, preferably greater than about 6, where an aspect ratio is a ratio of a depth of the opening to a width of the opening.

Example 32 provides the assembly according to Examples 30 or 31, where the dielectric liner occupies between about 1 and 90% of a volume of the opening.

Example 33 provides an integrated circuit package that includes a substrate and a component on the substrate, the component including a structure including at least one opening that includes a liner layer region including a dielectric material extending from (i.e. starting from) side walls towards a center of the opening by a first distance, an interface layer region including a dielectric material at least partially encompassed by the dielectric material of the liner layer region, and a center region including a dielectric material at least partially encompassed by the dielectric material of the interface layer region, where an average atomic percentage of a first chemical element within the liner layer region differs from an average atomic percentage of the first chemical element within the interface layer region by more than about 5%, e.g. by more than about 7%, preferably by more than about 10% or 15%.

Example 34 provides the integrated circuit package according to Example 33, where the component includes/is an interconnect, a transistor, a die, a sensor, a processing device, or a memory device.

Example 35 provides a computing device that includes a substrate and an IC die coupled to the substrate. The IC die includes a semiconductor device including a structure including at least one opening that includes a liner layer region including a dielectric material extending from (i.e. starting from) side walls towards a center of the opening by a first distance, an interface layer region including a dielectric material at least partially encompassed by the dielectric material of the liner layer region, and a center region including a dielectric material at least partially encompassed by the dielectric material of the interface layer region, where an average atomic percentage of a first chemical element within the liner layer region differs from an average atomic percentage of the first chemical element within the interface layer region by more than about 5%, e.g. by more than about 7%, preferably by more than about 10% or 15%.

Example 36 provides the computing device according to Example 35, where the computing device is a wearable or handheld computing device.

Example 37 provides the computing device according to Examples 35 or 36, where the computing device further includes one or more communication chips and an antenna.

Example 38 provides the computing device according to any of Examples 35-37, where the substrate is a motherboard.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The invention claimed is:

1. An assembly, comprising:
    a first region, the first region comprising a first dielectric material;
    a second region, the second region comprising a second dielectric material that is different from the first dielectric material;
    a third region between the first region and the second region, the third region comprising a third dielectric material that is different from the first dielectric material and the second dielectric material, and the third dielectric material having an uppermost surface at a same level as an uppermost surface of the first dielectric material and at a same level as an uppermost surface of the second dielectric material,
    wherein:
        the third region is at least partially enclosed by the first region,
        the second region is at least partially enclosed by the third region,
        the first region and the third region comprise a chemical element, and
        an average atomic percentage of the chemical element in the first region differs from an average atomic percentage of the chemical element in the third region by more than 5%; and
    a capping layer on the uppermost surface of the third region and on the uppermost surface of the second region, the capping layer having a dielectric material composition different than a dielectric material composition of the second region, wherein the capping layer has outermost sides that are within a perimeter defined by outermost sides of the third region.

2. The assembly according to claim 1, wherein an average atomic percentage of the chemical element in the second region-differs from the average atomic percentage of the chemical element in the first region by less than 3%.

3. The assembly according to claim 2, wherein:
    the chemical element is a first chemical element,
    an average atomic percentage of a second chemical element in the first region differs from an average atomic percentage of the second chemical element in the third region by more than 5%, and
    an average atomic percentage of the second chemical element in the second region-differs from the average atomic percentage of the second chemical element in the first region by less than 3%.

4. The assembly according to claim 2, wherein the structure further comprises:
    a fourth region comprising the first dielectric material and extending from the first interface region towards the center of the opening,
    a fifth region comprising a dielectric material at least partially encompassed by the fourth region, and
    the second region-is at least partially encompassed by the fifth region.

5. The assembly according to claim 4, wherein an average atomic percentage of the chemical element in the fourth region differs from an average atomic percentage of the chemical element in the fifth region or the average atomic percentage of the chemical element in the third region by more than 5%.

6. The assembly according to claim 4, wherein an average atomic percentage of the chemical element in the fourth region differs from an average atomic percentage of the chemical element in the second region-or the average atomic percentage of the chemical element in the first region by less than 3%.

7. The assembly according to claim 4, wherein the average atomic percentage of the chemical element in the fifth region differs from the average atomic percentage of the chemical element in the first region or an average atomic percentage of the chemical element in the second region-by more than 5%.

8. The assembly according to claim 1, wherein an average atomic percentage of the chemical element in the second region-differs from the average atomic percentage of the chemical element in the first region by more than 15%.

9. The assembly according to claim 1, wherein the first region occupies between 2 and 90% of a volume of the opening.

10. The assembly according to claim 1, wherein the opening has an aspect ratio greater than 6, where an aspect ratio is a ratio of a depth of the opening to a width of the opening.

11. The assembly according to claim 1, wherein the plurality of openings has depths of 5 to 170 nanometers.

12. The assembly according to claim 1, wherein the first dielectric material is a non-flowable dielectric material, and the second region is formed from a flowable dielectric material.

13. The assembly according to claim 12, wherein the first region is formed by coating one or more surfaces of a structure with the non-flowable dielectric material.

14. The assembly according to claim 12, wherein the second dielectric material is formed by:
    filling an opening at least partially enclosed by the first region with the flowable dielectric material; and
    after filing the opening, solidifying the flowable dielectric material.

15. The assembly according to claim 14, wherein the flowable dielectric material is solidified by cross-linking one or more bonds in the flowable dielectric material.

16. The assembly according to claim 9, wherein the second dielectric material is formed by:
   filling an opening at least partially enclosed by the first region with the flowable dielectric material; and
   after filing the opening, solidifying the flowable dielectric material.

17. An assembly, comprising:
   a structure comprising at least one opening, the opening filled with:
      a first region on side walls and a floor of the opening, the first region comprising a first dielectric material,
      a second region comprising a second dielectric material,
      a third region between the first region and the second region, the third region comprising a third dielectric material, and the third region having an uppermost surface at a same level as an uppermost surface of the first dielectric material and at a same level as an uppermost surface of the second dielectric material,
      wherein:
         the third region is at least partially enclosed by the first region,
         the second region is at least partially enclosed by the third region, and
         the first dielectric material, the second dielectric material, and the third material are different from each other, and
      a capping layer on the uppermost surface of the third region and on the uppermost surface of the second region, the capping layer having a dielectric material composition different than a dielectric material composition of the second dielectric material, wherein the capping layer has outermost sides that are within a perimeter defined by outermost sides of the third region.

18. The assembly according to claim 17, wherein the opening has an aspect ratio greater than 6, where an aspect ratio is a ratio of a depth of the opening to a width of the opening and wherein the first dielectric material occupies between 1 and 90% of a volume of the opening.

19. The assembly according to claim 17, wherein the first dielectric material is a non-flowable dielectric material, and the second region is formed from a flowable dielectric material.

* * * * *